United States Patent [19]
Kamikawa

[11] Patent Number: 6,164,297
[45] Date of Patent: Dec. 26, 2000

[54] CLEANING AND DRYING APPARATUS FOR OBJECTS TO BE PROCESSED

[75] Inventor: Yuji Kamikawa, Koshi-machi, Japan

[73] Assignee: Tokyo Electron Limited, Tokyo, Japan

[21] Appl. No.: 09/096,662

[22] Filed: Jun. 12, 1998

[30] Foreign Application Priority Data

Jun. 13, 1997 [JP] Japan .................................. 9-172794
Jun. 27, 1997 [JP] Japan .................................. 9-186024

[51] Int. Cl.$^7$ ........................................................ B08B 3/02
[52] U.S. Cl. ............................ 134/61; 134/95.2; 134/200; 134/902; 34/229
[58] Field of Search ................................ 134/95.2, 200, 134/181, 902, 102.3, 114, 61; 34/58, 229

[56] References Cited

U.S. PATENT DOCUMENTS

| | | | |
|---|---|---|---|
| 4,132,567 | 1/1979 | Blackwood | 134/102.3 |
| 4,286,541 | 9/1981 | Blackwood . | |
| 4,911,761 | 3/1990 | McConnell et al. . | |
| 5,222,310 | 6/1993 | Thompson et al. | 34/229 |
| 5,409,310 | 4/1995 | Owczarz | 134/95.2 |
| 5,431,178 | 7/1995 | Chiu | 134/95.2 |
| 5,520,744 | 5/1996 | Fujikawa et al. | 134/102.3 |
| 5,569,330 | 10/1996 | Schild et al. | 134/186 |
| 5,571,337 | 11/1996 | Mohindra et al. . | |
| 5,666,985 | 9/1997 | Smith, Jr. et al. | 134/95.2 |
| 5,738,128 | 4/1998 | Thompson et al. | 134/95.2 |
| 5,752,532 | 5/1998 | Schwenkler | 134/102.3 |
| 5,896,875 | 4/1999 | Yoneda | 134/102.3 |

FOREIGN PATENT DOCUMENTS

| | | | |
|---|---|---|---|
| 0 385 536 | 9/1994 | European Pat. Off. . | |
| 5-234974 | 9/1993 | Japan | 134/902 |

*Primary Examiner*—Frankie L. Stinson
*Attorney, Agent, or Firm*—Morrison & Foerster

[57] ABSTRACT

A cleaning and drying apparatus includes a cleaning bath 22 for collecting cleaning liquid for wafers, a drying chamber 23 arranged above the cleaning bath 22 to dry the wafers, a shutter 36 positioned between the cleaning bath 22 and the drying chamber 23 to define them communicably, a opening and closing mechanism 54 arranged outside a processing container to open and close the shutter 36, a connecting member 58 extending through an opening formed in an outer wall of the container to connect the shutter 36 with the mechanism 54, and a liquid sealing mechanism 60 for sealing the opening with sealing liquid. Another cleaning and drying apparatus is also provided with a wafer boat 24 for arranging the wafers at intervals horizontally and carrying the wafers, the drying chamber 23 which accommodate the wafers together with the wafer boat 24 for drying the wafers, dry-gas nozzles 37 for supplying dry gas to the wafers and a moving unit for moving the wafers in relation to the nozzles 37.

30 Claims, 28 Drawing Sheets

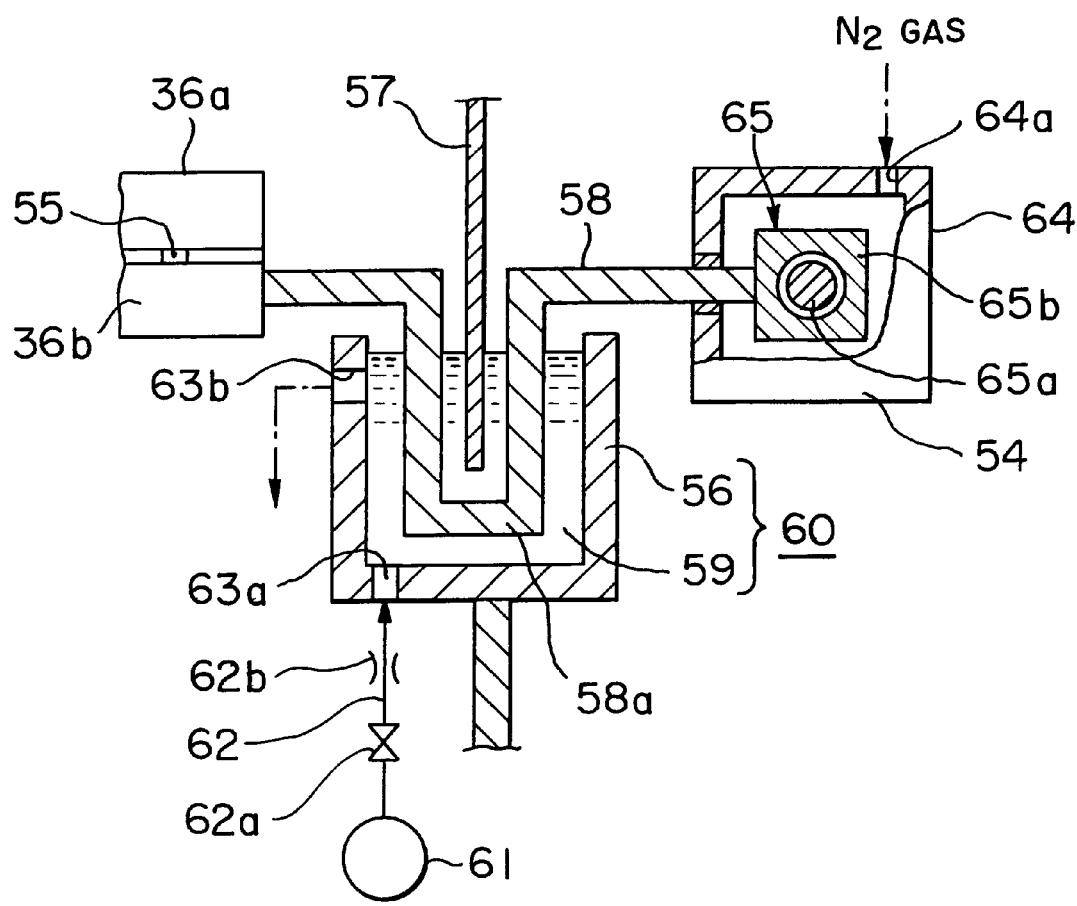
F I G. 6

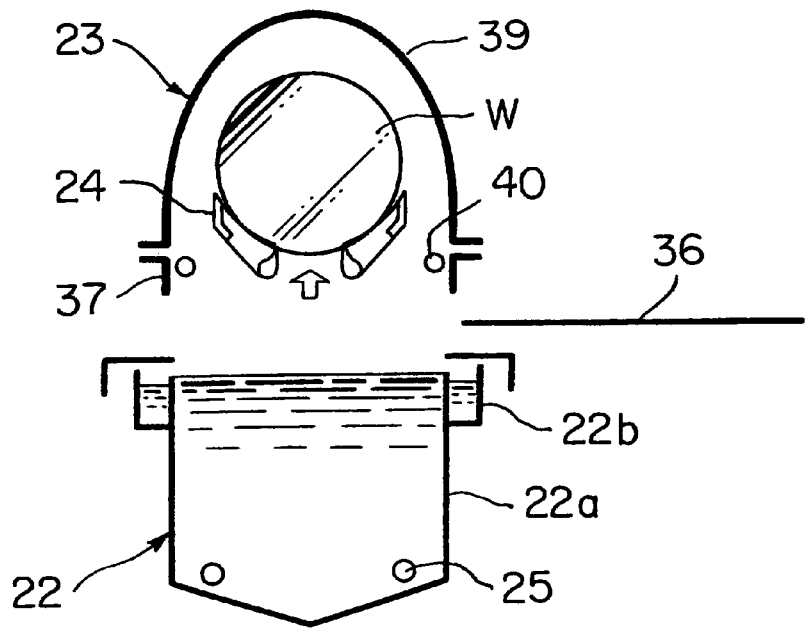
F I G. 18
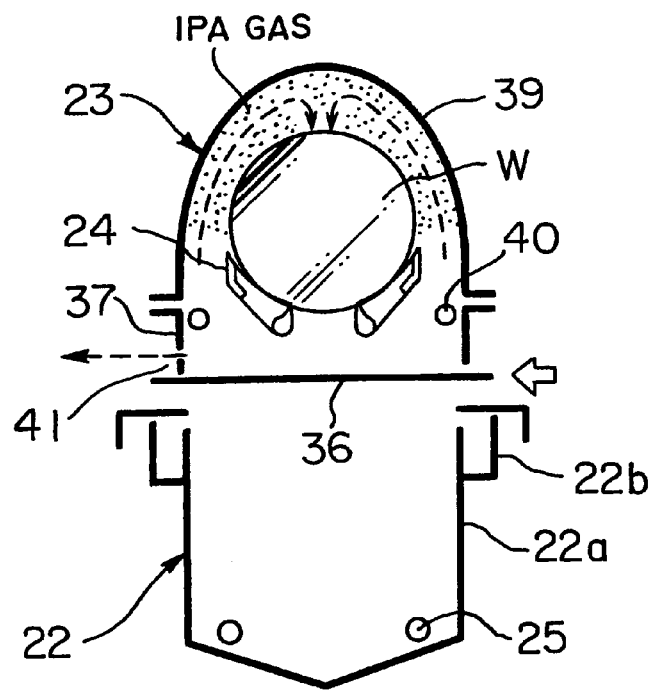
F I G. 19

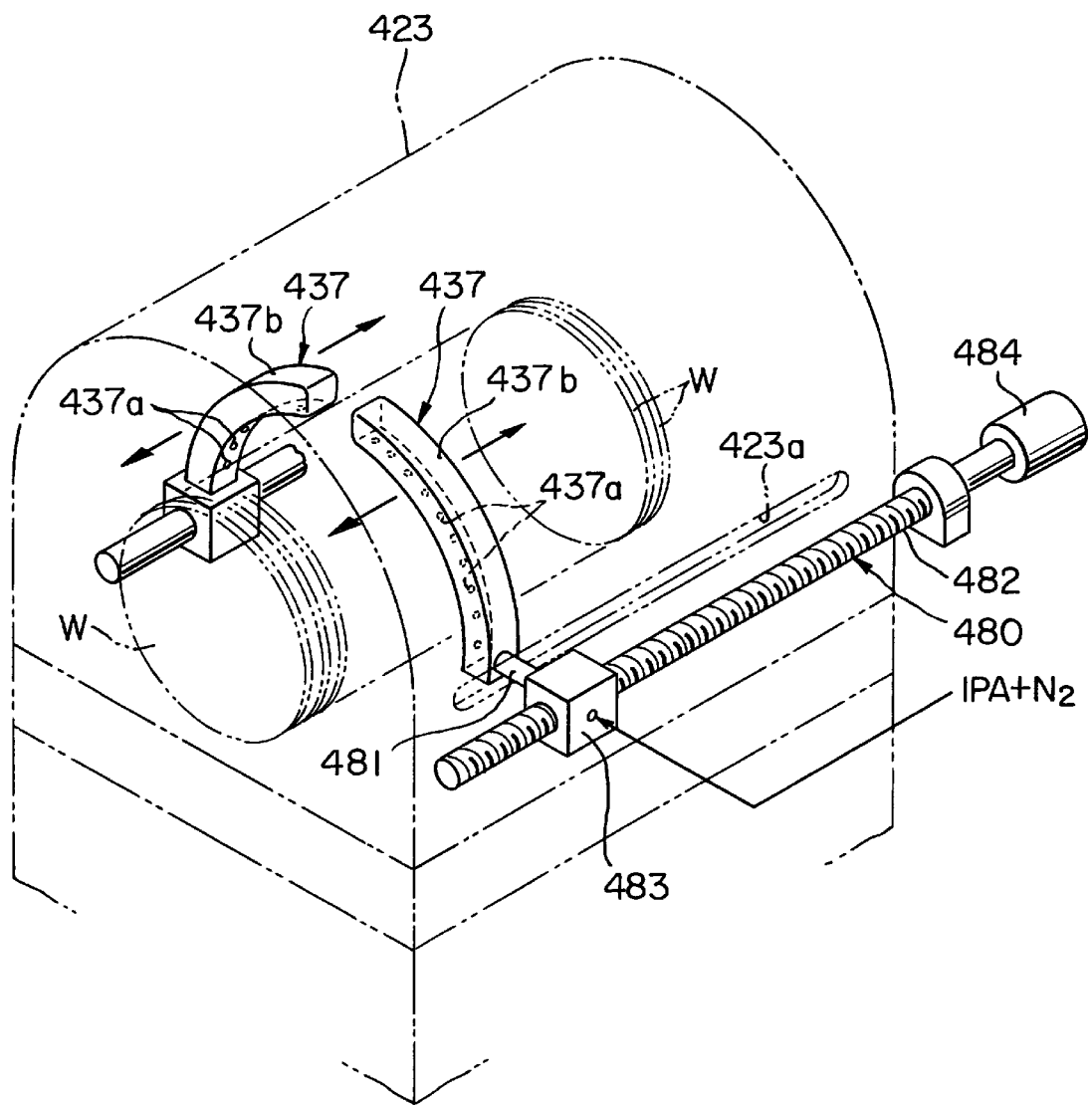
F I G. 31

CLEANING AND DRYING APPARATUS FOR OBJECTS TO BE PROCESSED

BACKGROUND OF THE INVENTION

1. Field of the Invention

The present invention relates to a cleaning and drying apparatus which cleans objects to be processed, such as semiconductor wafers and LCD (liquid crystal display) glass substrates etc., by immersing them in cleaning liquid, for example chemicals and rinsing liquids, and thereafter, dries the objects.

2. Description of the Related Art

Generally, in the field for producing semiconductor devices, there is a widely adopted cleaning process where the objects to be processed, such as semiconductor wafers and LCD glass substrates etc.(referred to "wafers etc." hereinafter), are successively immersed in a process bath filled up with the chemicals, the rinsing liquids or the like. In addition, there is also known a drying apparatus which dehydrates and dries the wafers etc. by contacting the surfaces of the wafers etc. after cleaning with dry gas of vapor of volatile organic solvent such as IPA (isopropyl alcohol) etc., for condensation or absorption of the vapor of the dry gas on the surfaces.

The conventional cleaning and drying apparatus mentioned above includes a drying section arranged above a cleaning section storing the cleaning liquid of the chemicals, the rinsing liquids or the like, and a shutter for opening and closing a communication port between the cleaning section and the drying section. In this cleaning and drying apparatus, after the wafers to be processed have been delivered from a conveying arm carrying the wafers to carrying means through the opened communication port, the wafers are cleaned in the cleaning section while withdrawing the conveying arm. After cleaning, the wafers are pulled up from the cleaning section and transferred into the drying section. Then, the cleaning section is separated from the drying section by closing the communication port by the shutter and thereafter, the dry gas is supplied into the drying section to dry the wafers.

In the above-mentioned conventional cleaning and drying apparatus, however, since the sealing about the shutter is undertaken by sealing members, for example O-rings etc., there still remains a possibility that the sealing between the cleaning section and a driving part for opening and closing the shutter is not accomplished perfectly, so that particles produced in the driving part enter into the cleaning section. In addition, there is also a possibility that an atmosphere in the cleaning section enters into the driving part, so that the performance of the driving part is influenced and the life span of the apparatus itself is reduced, disadvantageously.

Again, it should be noted that the above-mentioned drying apparatus is constructed so as to accommodate the plural wafers etc. in a drying chamber while being apart from each other at regular intervals in the horizontal direction and adapted so as to blow the dry gas against the wafers etc. through dry gas supplying means, such as gas nozzles, disposed in the drying chamber in order to dehydrate and dry the wafers etc.

In the so-constructed drying apparatus, however, since the above dry gas supplying means is fixed in a position, it is hard to supply the dry gas all over the surfaces of the wafers etc. uniformly. Thus, because of its unequal drying of the wafers etc., it may cause the drying efficiency to be deteriorated. Additionally, since a lot of dry gas is required to supply the dry gas all over the surfaces of the wafers etc., there are problems of increasing the gas consumption and requiring much time for the drying process.

SUMMARY OF THE INVENTION

Accordingly, it is therefore an object of the present invention to provide a cleaning and drying apparatus which is capable of preventing particles from entering into processing chambers through a driving part of a shutter for opening and closing a cleaning chamber and a drying chamber and which is capable of preventing an atmosphere in the processing chamber from entering the driving part, whereby the improvements of products yield and performance of the apparatus can be improved while increasing life span thereof.

It is another object of the present invention to provide a cleaning apparatus by which it is possible to improve the drying efficiency and reduce the consumption of the dry gas.

As the first aspect of the present invention, there is provided a cleaning and drying apparatus for cleaning and drying an object to be processed, the apparatus including:

a processing container having a cleaning chamber which accommodates cleaning liquid for cleaning the object to be processed therein and a drying chamber which is arranged above the cleaning chamber to dry the object to be processed;

a shutter arranged between the cleaning chamber and the drying chamber of the processing container, for partitioning the processing container into the cleaning chamber and the drying chamber communicably;

a shutter driving unit arranged outside the processing container, for opening and closing the shutter;

a communication aperture formed in an outer wall of the processing container;

a connecting member arranged so as to extend through the communication aperture, for connecting the shutter with the shutter driving unit; and liquid sealing means for sealing up the communication aperture through which the connecting member passes, with liquid.

Thus, since an opening and closing part of the shutter can be sealed up with the liquid sealing means in the airtight and watertight manner, it is possible to prevent particles produced in a driving part of the shutter from invading the drying and cleaning chambers. Accordingly, the cleaning and drying processes of the objects can be accomplished under the optimum conditions and therefore, the yield of products can be improved.

According to the second aspect of the present invention, in the above-mentioned cleaning and drying apparatus, the liquid sealing means includes:

a liquid reservoir bath having an inside reservoir bath arranged inside the communication aperture in the outer wall, the inside reservoir bath being opened upward and having its upper opening edge positioned above an upper end of the communication aperture, and an outside reservoir bath arranged outside the communication aperture in the outer wall, the outside reservoir bath being opened upward and having its upper opening edge positioned above the upper end of the communication aperture; and sealing liquid stored in the liquid reservoir bath so that liquid surface thereof is above the upper end of the communication aperture and beneath the upper opening end of the liquid reservoir bath;

and wherein the connecting member is bent so as to extend from the shutter to the shutter driving unit by way of an opening of the inside reservoir bath, the communication aperture in the outer wall, and an opening of the outside reservoir bath in sequence, while passing through the sealing liquid.

Therefore, since the upper opening edge of the communication aperture on the outer wall of the processing container is immersed in the sealing liquid, it is possible to define the shutter driving unit and the chambers. Thus, it is possible to prevent particles produced in the driving unit of the shutter from invading the drying and cleaning chambers and prevent respective atmospheres in the chambers from mixing into the driving part of the driving unit.

According to the third aspect of the present invention, in the cleaning and drying apparatus mentioned above, the liquid reservoir bath is provided, on a lower part thereof, with a supplying port for supplying the sealing liquid from a source thereof and also provided, on an upper part thereof, with a discharging port for discharging the sealing liquid overflowing.

Therefore, since it is possible to continuously fill and overflow a tub-shaped bath of the liquid sealing means with the supplied sealing liquid, it is possible to certainly seal up the driving unit of the shutter and the chambers in a watertight manner and receive the particles produced in the driving unit by the liquid sealing means and sequent discharge them from a drain part.

According to the fourth aspect of the present invention, in the cleaning and drying apparatus mentioned above, the shutter driving unit includes a driving part for driving the shutter and a casing filled with inert gas, for enclosing the driving unit.

Thus, since the driving part of the shutter driving unit is filled with an atmosphere of inert gas, it is possible to prevent the atmospheres in the chambers from mixing into the driving part certainly.

According to the fifth aspect of the present invention, in the cleaning and drying apparatus, the processing container is provided, on an inner wall thereof between the cleaning chamber and the drying chamber, with a sealing surface which receives a plate-shaped periphery of the shutter in its closed position thereby to define the cleaning chamber and the drying chamber; and the shutter comprises upper and lower shutter bodies which are plate-shaped and laid to overlap each other and relative movement means interposed between the upper shutter body and the lower shutter body, for relatively moving the upper and lower shutter bodies in directions close to and apart from each other.

Accordingly, by actuating the relative movement means in a manner that both of the upper and lower shutter bodies are separated from each other upward and downward, it is possible to urge the shutter against the sealing surface. Consequently, the cleaning chamber can be shut off from the drying chamber certainly.

According to the sixth aspect of the present invention, in the cleaning and drying apparatus, the processing container is provided, on an inner wall thereof between the cleaning chamber and the drying chamber, with a sealing surface which receives a plate-shaped periphery of the shutter in its closed position thereby to define the cleaning chamber and the drying chamber; and the cleaning and drying apparatus further comprises:

urging means disposed between the liquid sealing means and the shutter driving unit, for urging and moving the shutter in its closed position toward the sealing surface.

In this case, there is no need to provide a mechanical action part such as the above relative movement means in the processing container. Thus, it is possible to improve the cleanness of the processing container furthermore.

According to the seventh aspect of the present invention, there is also provided another cleaning and drying apparatus comprising:

objects carrying means for carrying a plurality of objects to be processed so as to be apart from each other in a horizontal direction;

a drying chamber for accommodating the objects together with the objects carrying means therein and drying the objects;

dry-gas supply means arranged in the drying chamber, for supplying dry gas to the objects to be processed; and moving means for moving the objects and the dry-gas supply means relatively to each other.

With the above-mentioned arrangement, owing to the relative movement of the objects and the dry-gas supply means, it is possible to supply the dry gas against the whole surfaces of the objects for its uniform contact, so that the resultant condensation or absorption of the dry-gas vapor causes the objects to be dehydrated and dried. That is, in spite of less supply of the dry gas, it is possible to dry the objects uniformly.

According to the eighth aspect of the present invention, in the above cleaning and drying apparatus, the dry gas contains vapor of organic solvent. Hereat, the above dry gas may be an inert gas, for example air, nitrogen gas (N2) or the like. Preferably, the dry gas is composed of vapor of organic solvent, such as alcohol-ketone family of IPA (isopropyl alcohol) etc. ether family, multivalent alcohol and so on.

According to the ninth aspect of the present invention, in the above cleaning and drying apparatus, the objects to be processed are shaped in the form of plates; and the dry-gas supply means includes a plurality of nozzles arranged at intervals in a direction to arrange the objects to be processed; and the moving means operates to move each of the nozzles in a plane parallel with each of the objects in the form of plates.

In this case, it is possible to contact the dry gas with the surfaces of the objects uniformly, so that the drying efficiency can be improved with a reduction of the dry-gas consumption.

According to the tenth aspect of the present invention, there is provided the above cleaning and drying apparatus in which the moving means operates to move each of the nozzles in a circumferential direction thereof.

Alternatively, according to the eleventh aspect of the present invention, the moving means operates to oscillate each of the nozzles in a plane parallel with each of the objects.

Alternatively, according to the twelfth aspect of the present invention, the moving means operates to move each of the nozzles vertically.

According to the thirteenth aspect of the present invention, there is provided the above cleaning and drying apparatus in which the objects to be processed are shaped in the form of plates;

the dry-gas supply means comprises a nozzle for ejecting gas to the objects to be processed; and the moving means operates to move the nozzle in a direction to arrange the objects to be processed.

Also in this case, it is possible to contact the dry gas with the surfaces of the objects uniformly, so that the drying efficiency can be improved with a reduction of the dry-gas consumption.

According to the fourteenth aspect of the present invention, there is provided the above cleaning and drying apparatus in which the objects to be processed are shaped in the form of plates;

the dry-gas supply means has a plurality of nozzles arranged at intervals in a direction to arrange the objects to be processed; and the moving means operates to rotate the objects as a center axis along the direction to arrange the objects to be processed.

Consequently, it is possible to contact the dry gas with the surfaces of the objects uniformly, so that the drying efficiency can be improved with a reduction of the dry-gas consumption.

According to the fifteenth aspect of the present invention, there is also provided the above cleaning and drying apparatus in which the drying chamber is positioned above a cleaning chamber for cleaning the objects to be processed.

Therefore, with the above-mentioned arrangement, it is possible to pull up the objects cleaned in the cleaning bath in order to dry them.

According to the sixteenth aspect of the present invention, in the above cleaning and drying apparatus, the objects carrying means is movable so as to shuttle between the cleaning chamber and the drying chamber.

Thus, owing to the objects carrying means movably arranged between the cleaning chamber and the drying chamber, it is possible to move the objects to the cleaning chamber and the drying chamber by the same means, whereby the drying process after cleaning can be carried out more effectively.

According to the seventeenth aspect of the present invention, in the above cleaning and drying apparatus, the drying chamber includes a sealable container which has, on a bottom thereof, a supply port for supplying cleaning liquid and a discharging port for discharging the cleaning liquid and, on an upper side of thereof, an overflow pipe for overflowing the cleaning liquid supplied into the sealable container.

Therefore, the above-mentioned arrangement allows the drying chamber to be also used as cleaning chamber. Thus, it is possible to develop the miniaturization of the apparatus and carry out the cleaning and drying processes in the same chamber, improving the operative efficiency in the cleaning and drying processes.

The above and other features and advantages of this invention will become apparent, and the invention itself will best be understood, from a study of the following description and appended claims, with reference had to the attached drawings showing a preferred embodiment of the invention.

BRIEF DESCRIPTION OF THE DRAWINGS

FIG. 6 is an enlarged cross sectional view showing a liquid sealing mechanism of the cleaning and drying apparatus of FIG. 5;

FIG. 18 is a schematic cross sectional view of the cleaning and drying apparatus, showing a condition of loading the substrates into a drying chamber;

FIG. 19 is a schematic cross sectional view of the cleaning and drying apparatus, showing a condition of drying the substrates;

FIG. 31 is a schematic perspective view of the essential part of the cleaning and drying apparatus of FIG. 30, in accordance with the fourth embodiment of the invention;

DESCRIPTION OF THE PREFERRED EMBODIMENT

A variety of embodiments of the present invention will be described with reference to drawings. Note, in common with the follwing embodiments, the cleaning and drying apparatuses of the invention are applied to a cleaning system for semiconductor wafers.

[1st. embodiment]

Figure 1:
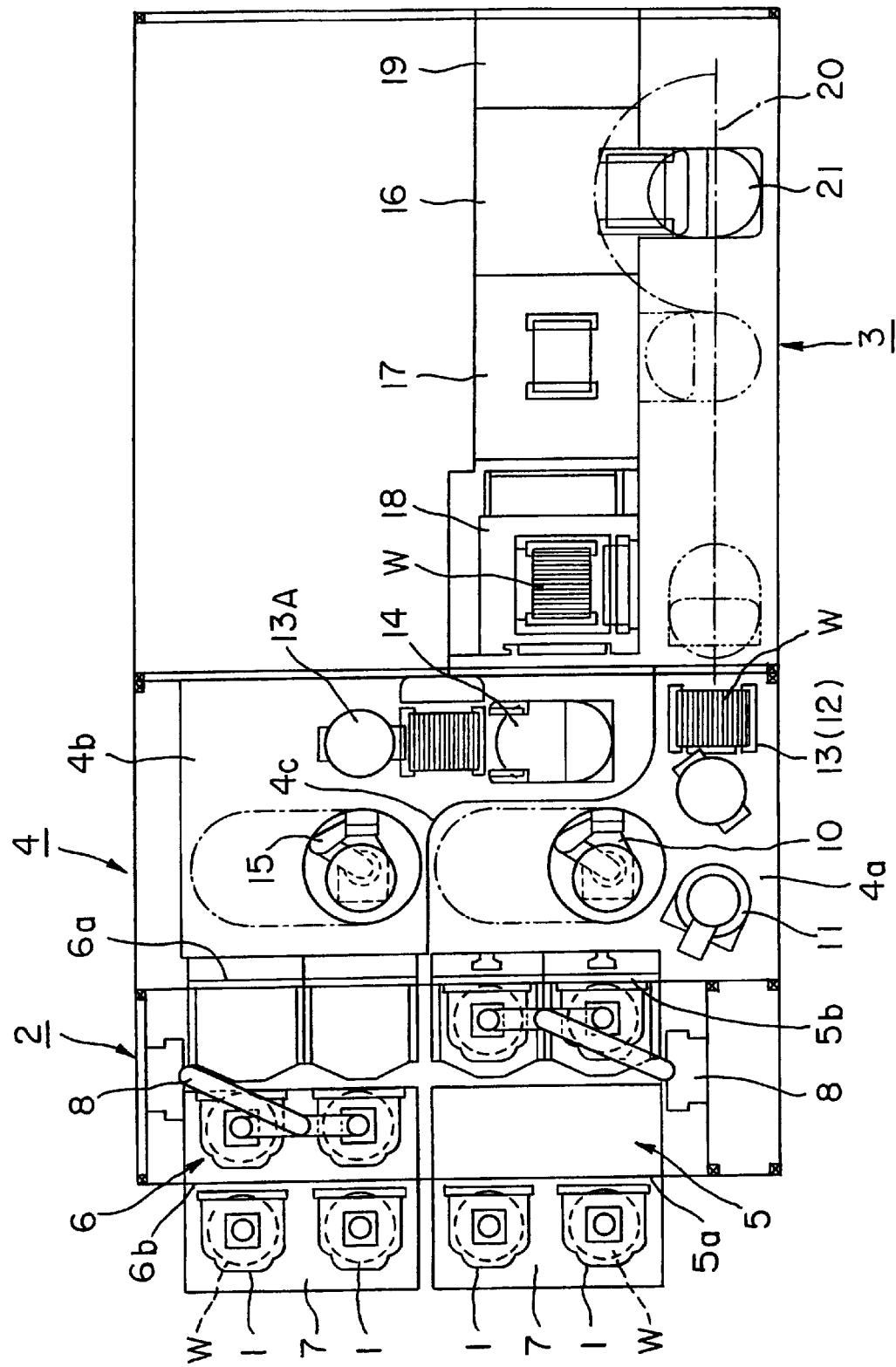
FIG. 1 is a schematic plan view of a cleaning system to which a cleaning and drying apparatus in accordance with the present invention is applied.
Figure 2:
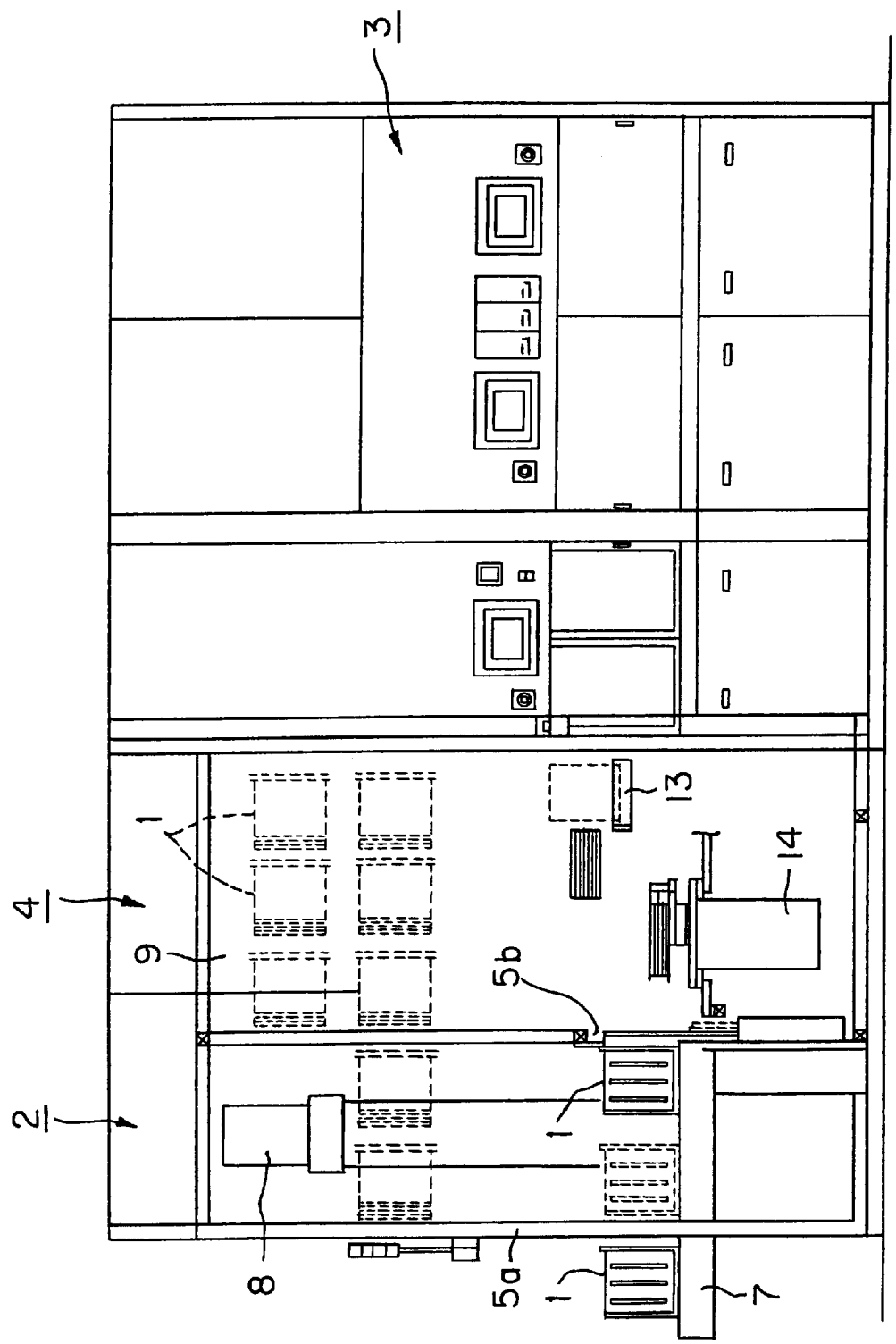
FIG. 2 is a schematic side view of the cleaning system of FIG. 1.
Figure 3:
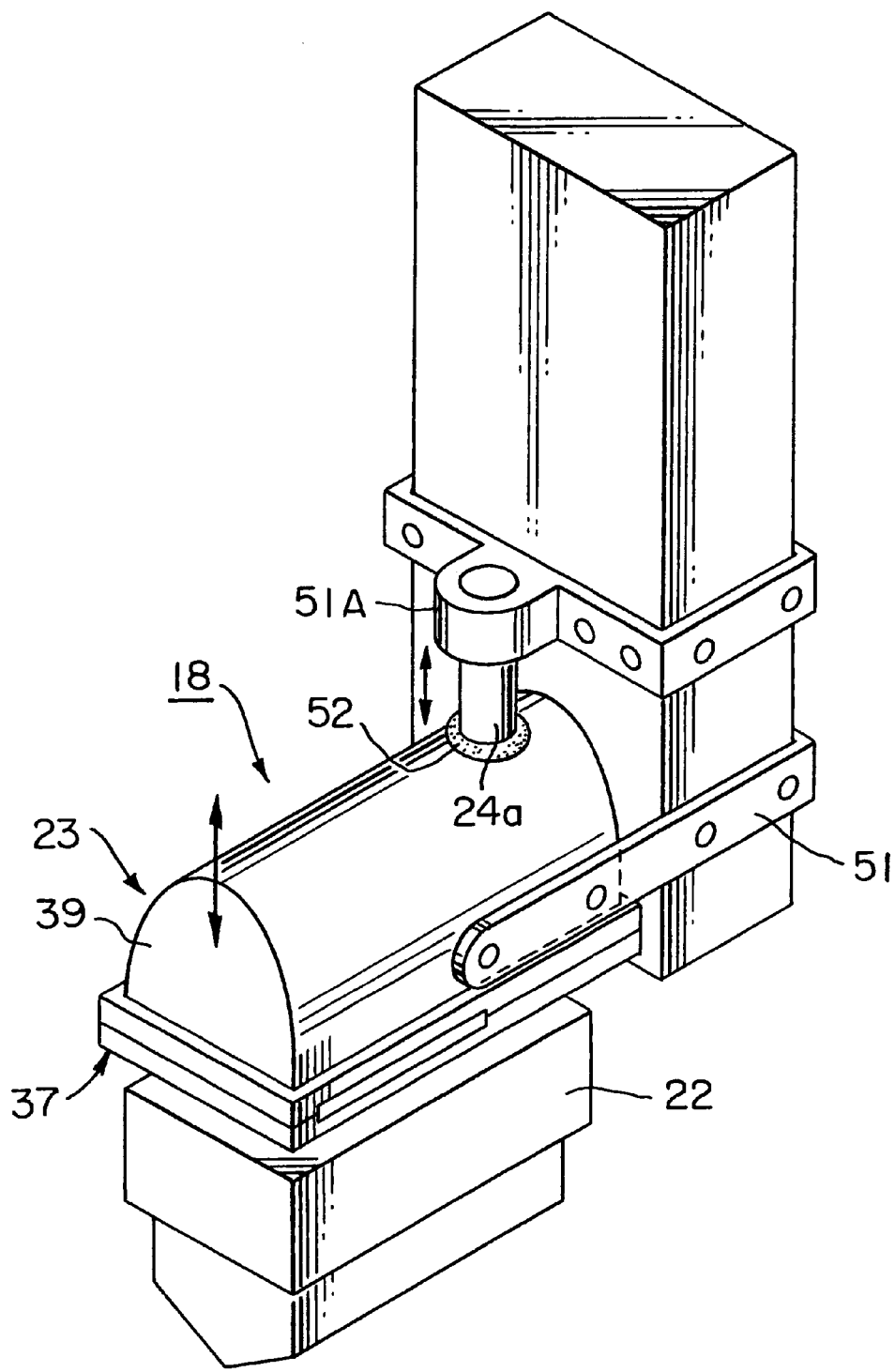
FIG. 3 is a schematic perspective view of the cleaning and drying apparatus, showing an example of the invention.

FIG. 1 is a schematic plan view showing one example of the cleaning system to which the cleaning and drying apparatus of the first embodiment is applied and FIG. 2 is a schematic side view of the system.

The cleaning system mainly includes a conveying section 2 through which containers, for example carriers 1 for accommodating semiconductor wafers W (simply referred as "wafers" hereinafter) as substrates to be processed, horizontally are carried in and out, a processing section 3 in which the cleaning process for the wafers W is carried out by using chemicals, cleaning liquids etc. and thereafter, the drying process is carried out, and an interface section 4 which is arranged between the conveying section 2 and the processing section 3, for delivering the wafers W therebetween while adjusting and changing the position and posture of the wafers W.

The conveying section 2 comprises an input (carry-in) part 5 and an output (carry-out) part 6, both of which are juxtaposed to each other on one side of the cleaning system. Provided in an input port 5a of the input part 5 and an output port 6a of the output part 6 are slide tables 7 which loads the carriers 1 into the parts 5 and 6 and also unloads them out of the parts 5 and 6. Carrier lifters 8 are arranged in the input and output parts 5 and 6, respectively. Owing to the provision of the carrier lifters 8, the carriers 1 can be conveyed between the input parts or the output parts and the vacant carriers 1 can be delivered to and from a carrier stand-by part 9 arranged above the conveying section 2 (see FIG. 2).

The interface section 4 is divided to a first chamber 4a and a second chamber 4b adjoined to the input part 5 and the output part 6 through a partition wall 4c, respectively. Arranged in the first chamber 4a are a wafer pick-up arm 10 which picks a plurality of wafers W out of the carriers 1 and transports them and which is movable in the horizontal and vertical directions (X, Y, Z) and is rotatable in the direction θ; a notch aligner 11 which detects notches formed on the wafers W; and a first posture changing device 13 which includes a clearance adjusting mechanism 12 for adjusting clearances among the plural wafers W picked up by the wafer pick-up arm 10 and which changes the posture of the wafers W from their horizontal posture to the vertical posture.

Similarly arranged in the second chamber 4b are a wafer delivery arm 14 which receives and transports the plural wafers W, which have been processed and arranged vertically, from the processing section 3; a second posture changing device 13A which changed the posture of the wafers W delivered from the arm 14 from the vertical arrangement to the horizontal arrangement vertical posture; and a wafer accommodating arm 15 which receives the plural wafers W in the horizontal arrangement and subsequently accommodates them in the empty carriers 1 conveyed into the output part 6 and which is also movable in the horizontal and vertical directions (X, Y, Z) and is rotatable in the direction θ. Note, the second chamber 4b is constructed so as to be closed up from the outside and replaced with $N_2$ gas supplied from a not-shown gas source of inert gas, for example nitrogen ($N_2$) gas.

In the processing section 3, a first processing unit 16 for eliminating particles and organic contaminants adhering to the wafers W, a second processing unit 17 for eliminating metallic contaminants adhering to the wafers W, a cleaning and drying apparatus 18 of the invention as a cleaning and drying unit for eliminating chemical oxidation layers on the wafers W and sequent drying them, and a chuck-cleaning unit 19 are arranged in series. Arranged in a conveyer path 20 opposing the respective units 16–19 is a wafer conveyer arm 21 which can move in the directions of X, Y (horizontal directions) and Z (vertical direction) and rotate in the direction θ.

As shown in FIGS. 3–13, the above cleaning and drying apparatus 18 essentially includes a cleaning bath 22 (cleaning chamber) in which cleaning liquid, such as chemicals (e.g. fluorohydroacid) and pure wafer, is accommodated and the wafers W are immersed in the accommodated cleaning liquid, a drying chamber 23 arranged above the cleaning bath 22 and carrier means, for example a wafer boat 24 for carrying the plural wafers W (e.g. fifty wafers) and moving the wafers W in the cleaning bath 22 and the drying chamber 23.

The cleaning bath 22 includes an inner bath 22a of e.g. silica members or polypropylene material and an outer bath 22b arranged outside an upper end of the inner bath 22a, for receiving the cleaning liquid overflowing the inner bath 22a. The inner bath 22a is provided, on both sides of a lower part thereof, with cleaning liquid nozzles 25 which eject the cleaning liquid to the wafers W in the cleaning bath 22. By supplying the chemicals or pure water from a not-shown liquid source connected to the cleaning liquid nozzles 25 through control valves, the cleaning bath 22 is adapted so as to store the chemicals or the pure water. Additionally, the inner bath 22a has a drain port formed at the bottom and connected to a drain pipe 26 interposing an exhaust valve 26a. Similarly, another drain pipe 27 interposing an exhaust valve 27a is connected with a drain port at the bottom of the outer bath 22b. Note, an exhaust box 28 is arranged outside the outer bath 22b and provided with an exhaust port connected to an exhaust pipe 29 through a valve 29a.

The above-constructed cleaning bath 22 and the exhaust box 28 are disposed in a cylindrical box 30 with a bottom. Owing to the provision of a horizontal partition 31, the box 30 is divided into an upper chamber 32a on the side of the cleaning bath 22 and a lower chamber 32b on the respective sides of the drain port of the drain pipe 26 connected to the inner bath 22a, the drain port of the drain pipe 27 connected to the outer bath 22b and the exhaust port of the exhaust pipe 29. With this separation, it is possible to prevent an atmosphere in the lower chamber 32 and splashes of waste liquid from entering the upper chamber 32a, whereby the cleanness of the upper chamber 32a can be maintained. An exhaust window 33 is formed in a sidewall of the upper chamber 32a, exhaust windows 34 on an upper portion of the sidewall of the lower chamber 32b, and a drain port 35 is formed on a lower portion of the sidewall of the lower chamber 32b.

The drying chamber 23 includes a fixed base 37 communicating with an opening 22c of the cleaning bath 22 through a shutter 36 and a drying chamber body 39 abutted on the fixed base 37 through a sealing member, for example an O-ring 38.

Figure 5:
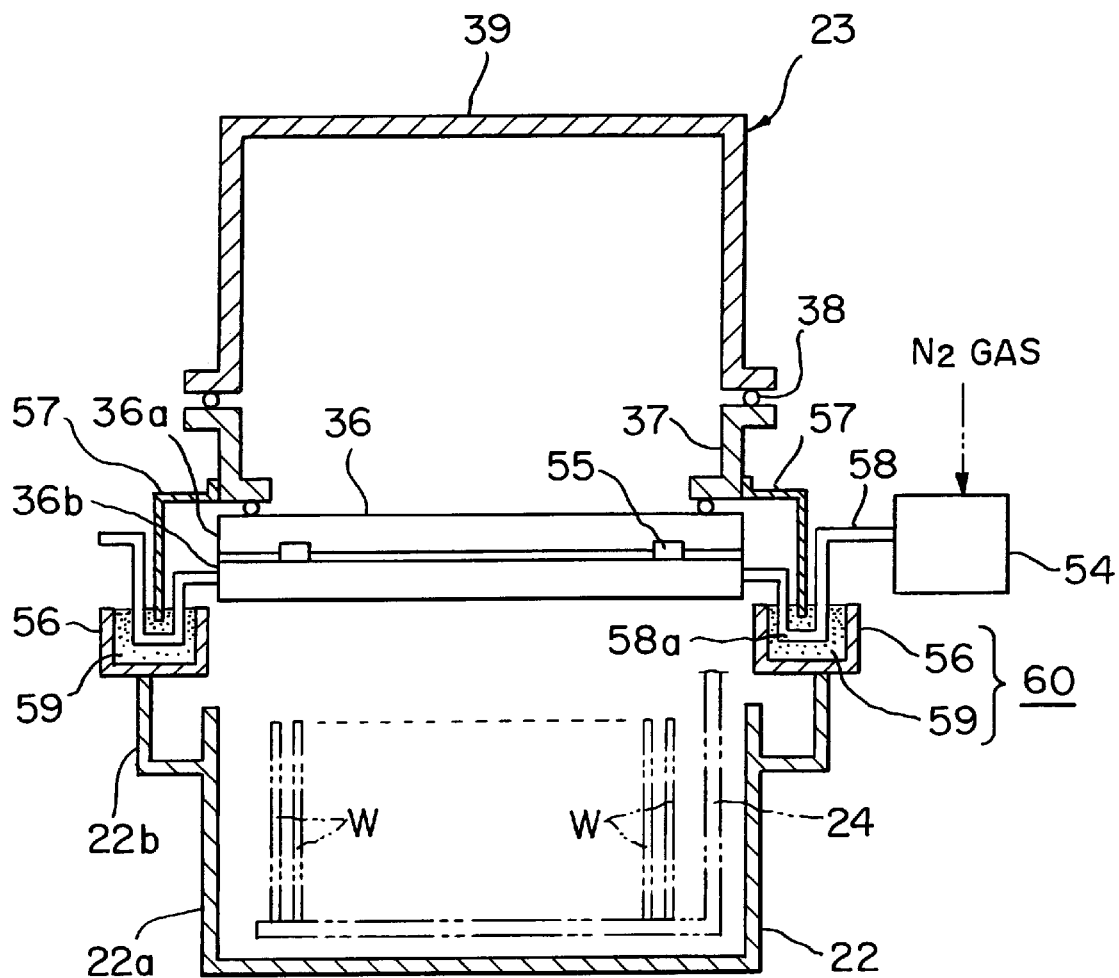
FIG. 5 is a schematic cross sectional view showing an essential part of the cleaning and drying apparatus of FIG. 4.
Figure 7:
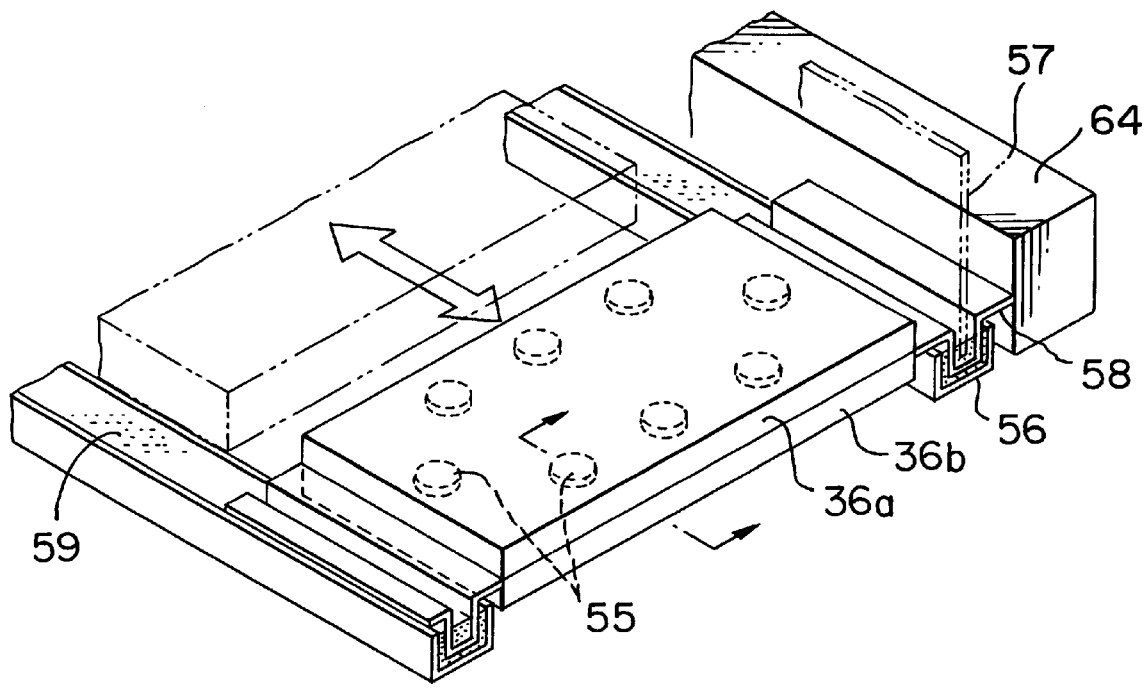
FIG. 7 is a perspective cross sectional view showing a shutter and the liquid sealing mechanism of the cleaning and drying apparatus of FIG. 4.
Figure 8:
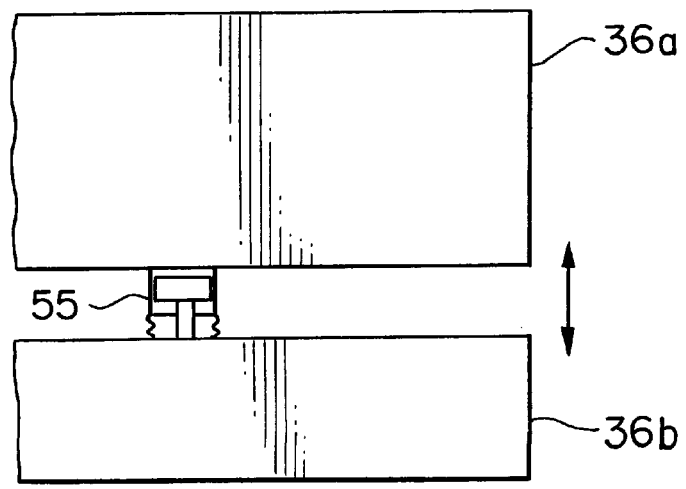
FIG. 8 is an enlarged cross sectional view showing the shutter of the cleaning and drying apparatus of FIG. 4.

As shown in FIG. 5, the shutter 36 is divided into an upper shutter body 36a and a lower shutter body 36b and adapted so as to adjust a clearance between the bodies 36a, 36b by a plurality of cylinders 55 (e.g. eight cylinders) interposed therebetween (see FIGS. 7 and 8). The so-constructed shutter 36 allows the respective shutter bodies 36b, 36a to establish contact with the cleaning bath 22 and the drying chamber 23, respectively, while the shutter 36 is being closed. Therefore, it is possible to ensure the insulation of the cleaning bath 22 and the drying chamber 23 furthermore. Note, if only allowing the clearance between the upper shutter body 36a and the lower shutter body 36b to be adjustable, the cylinders 55 may be replaced with, for example expandable tubes by an air-pump etc.

Formed so as to project from both sides of the upper shutter body 36b with respect to the closing direction of the shutter 36 are wing pieces 58 which have crank-shaped cross sections and one of which is connected with opening and closing means 54 (referred as "moving means", hereinafter). Both wing pieces 58 are movably arranged while respective bent portions 58a of the pieces 58 are immersed in sealing liquid 59 stored in tub-shaped baths 56 mounted on the cleaning bath 22.

In this way, a liquid sealing mechanism 60 of the invention is constituted by the tub-shaped bath 56 which is movably accommodating the bent portion 58a of the wing piece 58 projecting from the shutter 36 and the sealing liquid 59 which is stored in the bath 56 to immerse the bent portion 58a of the wing piece 58. Owing to the liquid sealing mechanism 60 constructed above, it is possible to seal the cleaning bath 22 from the outside in the airtight and watertight manner. Note, a similar liquid sealing mechanism is also defined on the opposite side of the cleaning bath 22 to the moving means 54.

Again, the cleaning bath 22 is separated from the moving means 54 by the partition 57 on one side, and furthermore the lower end of each partition 57 is immersed in the sealing liquid 59 at the interior of the bent portion 58a of the wing piece 58 in the tub-shaped bath 56. Therefore, it is possible to insulate the processing area in the cleaning bath 22 from the atmosphere on the side of the moving means 54 certainly.

As shown in FIG. 6, each tub-shaped bath 56 is provided, at a bottom thereof, with a supply port 63a to which a liquid source 61 is connected through the intermediary of a supply pipe 62 interposing a valve 62a and a throttle 62b. Further, each bath 56 has a drain port 63b formed on an upper part of the sidewall, for discharging the sealing liquid 59 overflowing the bath 56.

As mentioned above, since the sealing liquid 59 from the liquid source 61 flows into the tub-shaped bath 56 gradually but continuously and overflows through the drain port 63b, it is possible to fill the tub-shaped bath 56 with the sealing liquid 59 continuously. Thus, the driving part for the shutter 36 on the side of the moving means 54 and the processing area of the cleaning bath 22 can be sealed to each other in the watertight manner. In addition, it is also possible to catch particles generated from the moving means 54 by the above-mentioned liquid sealing mechanism 60 and sequent discharge them through the drain port 63b.

As shown in FIG. 6, the driving part of the moving means 54 is constituted by a ball screw mechanism 65 consisting of a screw shaft 65a and a movable body 65b movable engaged with the screw shaft 65a through a large number of balls (not-shown) and connected to the wing piece 58. With the rotation of the screw shaft 65a driven by a not-shown motor, the movable body 65b is moved in the axial direction, so that the shutter 36 can be opened and closed.

The ball screw mechanism 65 of the moving means 54 is accommodated in a casing 64. The casing 64 is provided, on a top thereof, with a supply port 64a which is connected to an not-shown inert-gas source, for supplying inert gas, e.g. nitrogen ($N_2$) gas into the casing 64. In this way, by positioning the ball screw mechanism 65 of the moving means 54 under the atmosphere of $N_2$ gas, it is possible to prevent the atmosphere in the cleaning area from entering into the driving part of the moving means 54 certainly.

Note, although the driving part of the moving means 54 is constituted by the ball screw mechanism 65 in the above-mentioned embodiment, it may be replaced with another mechanism, such as a cylinder, a timing belt or the like, in the modification.

Figure 9:
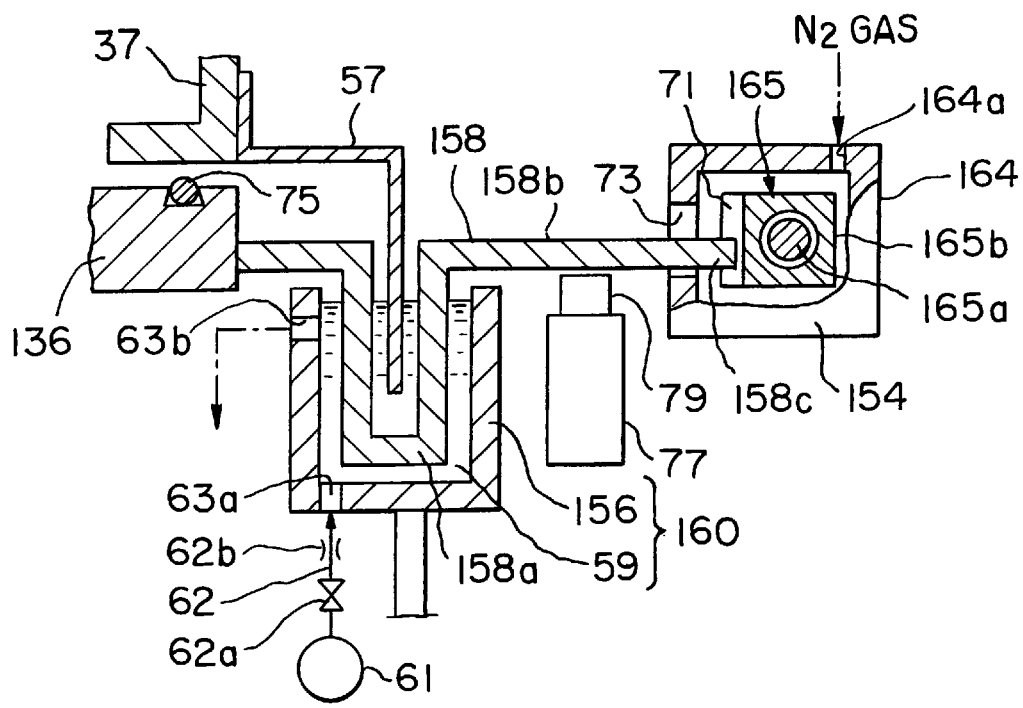
FIG. 9 is a cross sectional view showing another example of the liquid sealing mechanism of FIG. 6.
Figure 10:
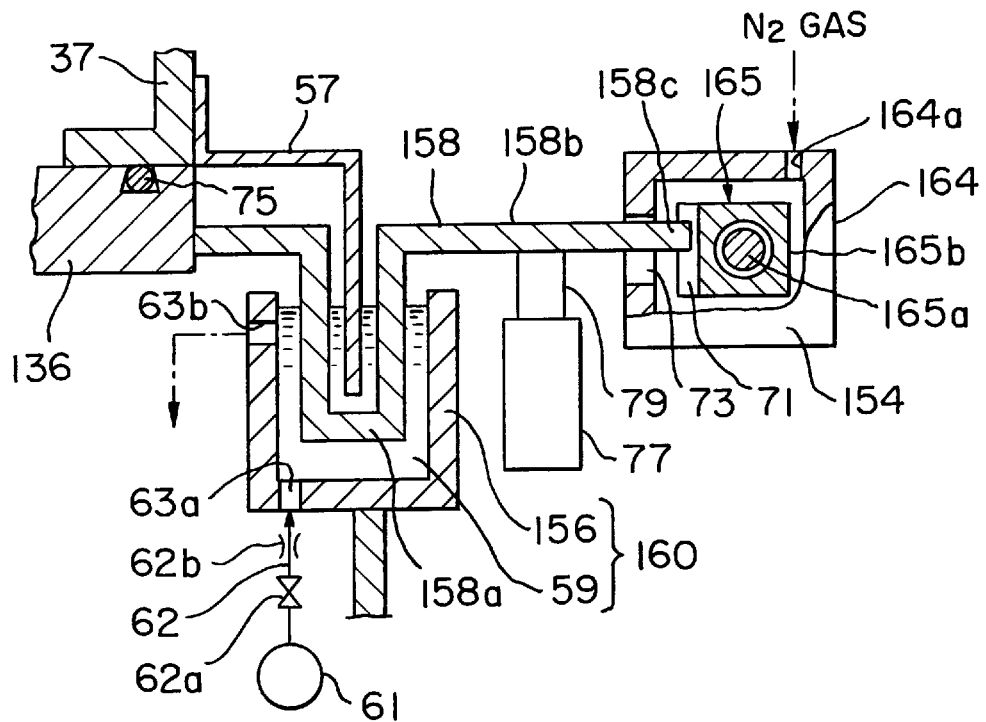
FIG. 10 is a cross sectional view of the liquid sealing mechanism of FIG. 9, showing a condition where the shutter is moved upward.

FIGS. 9 and 10 show another example of the sealing mechanism beside the shutter. In these figures, elements similar to those of the afore-mentioned sealing mechanism of FIGS. 5–7 are indicated with the same reference numerals respectively, and respective descriptions of the elements are eliminated.

In this sealing mechanism beside the shutter, a shutter 136 is not divided into two pieces but integrated in the form of one plate.

Figure 11:
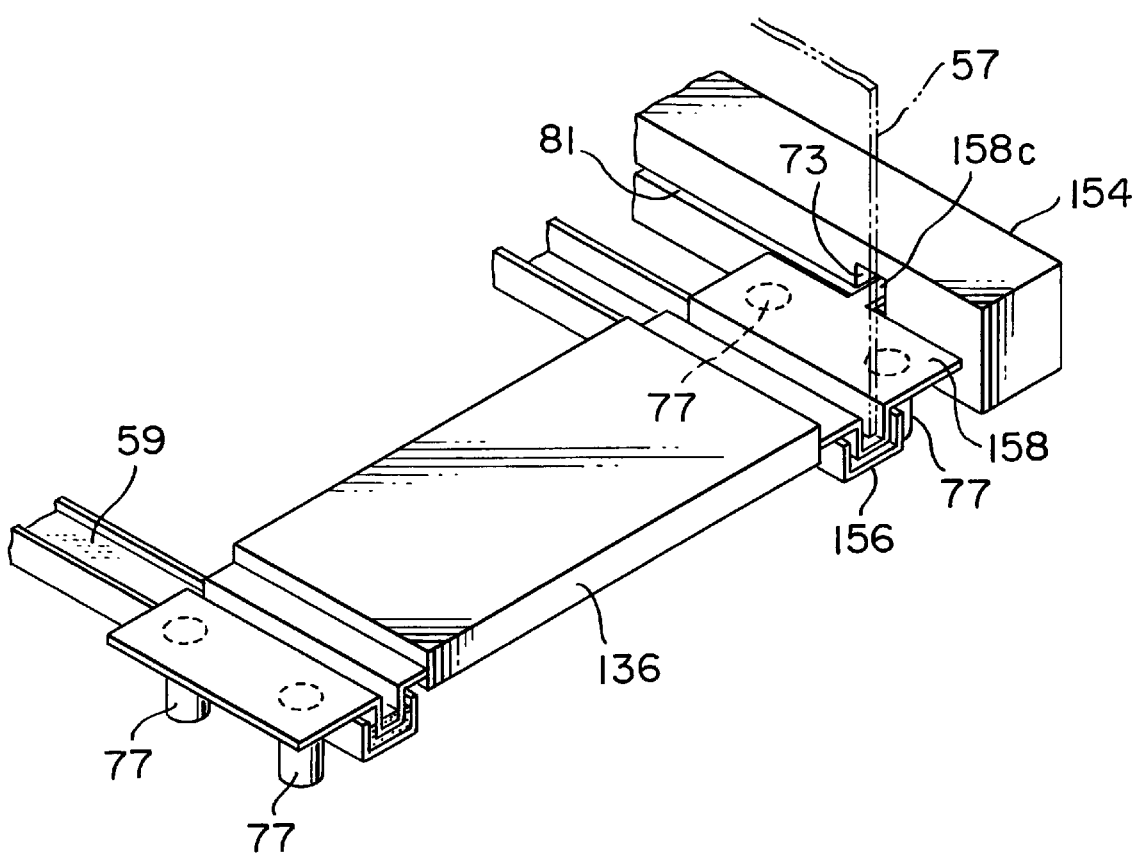
FIG. 11 is a perspective view showing the liquid sealing mechanism of FIG. 9.

According to this modification, there are provided a plurality of actuators 77 each of which is positioned between a liquid sealing mechanism 160 and opening/closing moving means 154. As shown in FIG. 11, two actuators 77 are arranged on each side of the shutter 136 in its closed position. Owing to the provision of the actuators 77, wing pieces 158 of the shutter 136 brought into the closed position by the moving means 154, can be elevated by respective rods 79 of the actuators 77.

The wing piece 158 is provided, on the side of the moving means 154, with a portion 158b which is larger than that of the wing piece of FIG. 6 by a length required to interpose the actuator 77. A leading end 158c of the portion 158b is adapted so as to project into a casing 164 through a hole 73 formed upward and downward of the casing 164. An engagement groove 71 is formed on a movable body 165b of a ball screw mechanism 165. The leading end 158c of the wing piece 158 is engaged in the engagement groove 71 so as to move in the upward and downward directions. With the axial movement of the movable body 165b, the leading end 158c is moved in the same direction. Additionally, the leading end 158c can be moved by the operation of the actuators 77 in the upward and downward directions.

Considering the vertical movement of each wing piece 158 in relation to the partition 57, a bent portion 158a of the wing piece 158 is formed longer than the bent portion 58a of FIG. 6 in the upward and downward directions. In addition, each tub-shaped bath 156 is deeply formed so as to allow the upward and downward movements of the wing piece 158.

In the above-mentioned arrangement, when it is required to move the shutter 136 from the opened position to the closed position, the ball screw mechanism 165 of the moving means 154 is activated to move the movable body 165b firstly. Consequently, the leading end 158c engaging with the engagement groove 71 of the movable body 71 is moved in a slit 81 formed in the casing 164, so that the shutter 136 attached to the wing pieces 158 moves to the closed position, as shown in FIG. 11. When the shutter 139 reaches the closed position, the actuators 77 are activated to move the wing pieces 158 upward. Then, the leading end 158c of the wing piece 158 is moved in the engagement groove 71 of the movable body 165b upward. Note, in the closed position of the shutter 139, the leading end 158c is positioned in the hole 73 at the end of the slit 81. Therefore, the leading end 158c can move upward without the interference of the casing 164. In this way, the shutter 136 is displaced upward to press an O-ring on the fixed base 37, so that the drying chamber is sealed. Note, since the tub-shaped baths 156 and the bent portions 158a are formed longer than those of FIG. 6, it is possible to maintain the effects of the liquid sealing mechanism 160 in spite of the upward movement of the wing pieces 158. In order to move the shutter 136 to the opened position, the above-mentioned processes have only to be reversed.

Figure 4:
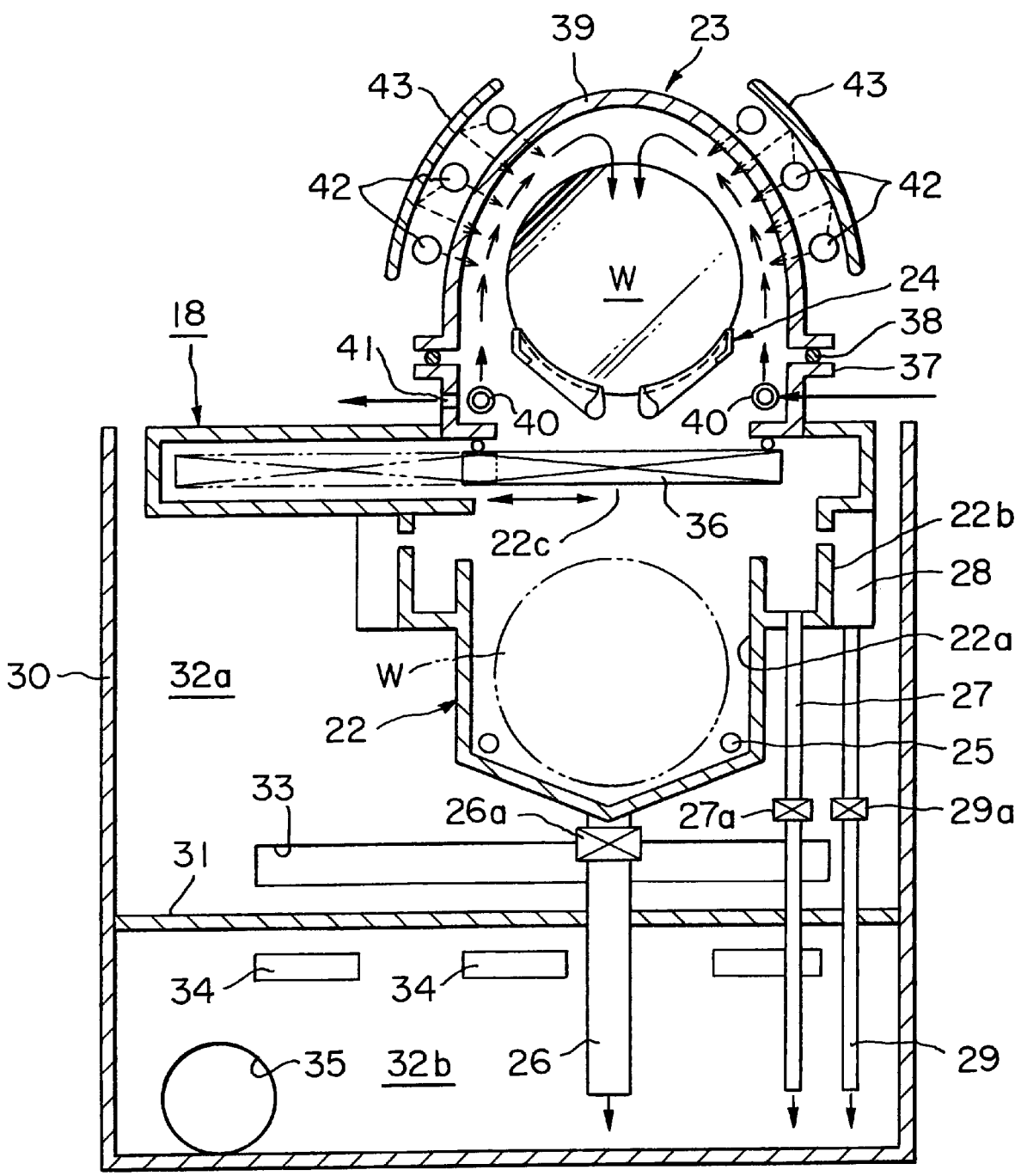
FIG. 4 is a cross sectional view of the cleaning and drying apparatus in accordance with a first embodiment of the invention.

As shown in FIG. 4, the drying chamber 23 includes the drying chamber body 39 as the silica member of reverse U-shaped cross section and the fixed base 37 also made of the silica member, so that the condition of the wafers W accommodated in the chamber 23 is visible from the outside. On both sides of the interior of the fixed base 37 defining the drying chamber 23, supply parts 40 are provided for supplying the dry gas of solvent vapor (e.g. IPA) upward. Additionally, the fixed base 37 has an exhaust part 41 formed on the sidewall, for discharging the dry gas. The supply parts 40 are connected to a not-shown IPA gas source and a not-shown carrier gas (e.g. N2) heater for feeding the dry gas on pressure, while the exhaust part 41 is connected to a not-shown exhaust unit. Thus, owing to the provision of the supply parts 40 and the exhaust part 41, the dry gas supplied into the drying chamber 23 through the supply parts 40 flows along the inner walls on both sides of the chamber body 39 upward and sequentially flows from the center of the chamber 23 toward the exhaust part 41 downward, as shown with arrows of FIG. 4. Consequently, it is possible to bring the wafers W into uniform contact with the dry gas while condensing the dry gas vapor for uniform drying. Note, in the modification, the shutter 36 may be provided with the above exhaust part.

Heat lamps 42 (light source for heating) are arranged on both sides of the drying chamber body 39 and reflection plates 43 are disposed on the back of the heat lamps 42. In this way, since the interior of the drying chamber 23 is heated by light irradiated from the lamps 42 and reflected by the reflection plates 43, the drying of the wafers W can be promoted in the drying chamber 23.

Figure 12:
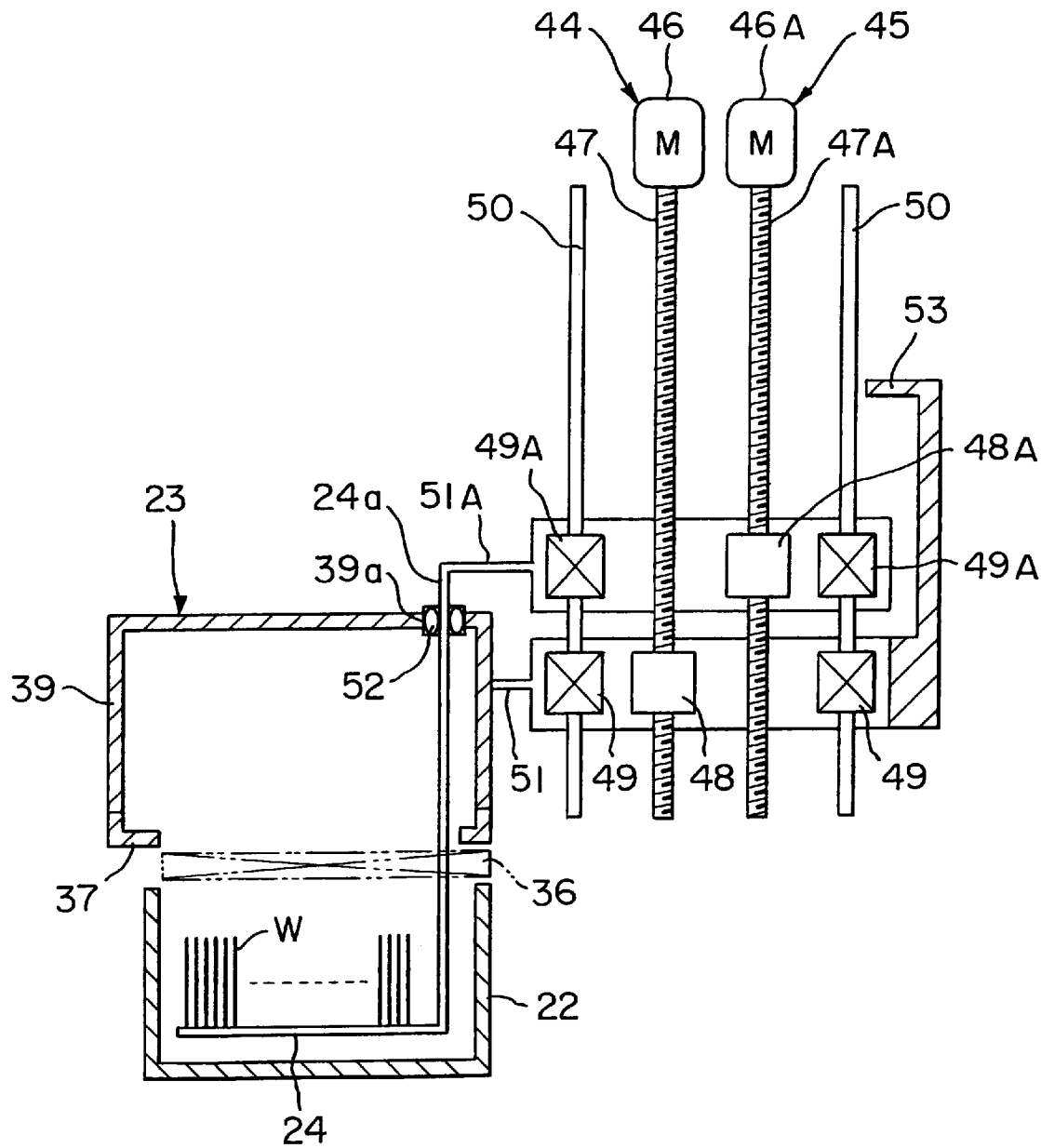
FIG. 12 is a cross sectional view of elevating means for a drying chamber body and carrying means of the cleaning and drying apparatus of the invention.
Figure 13:
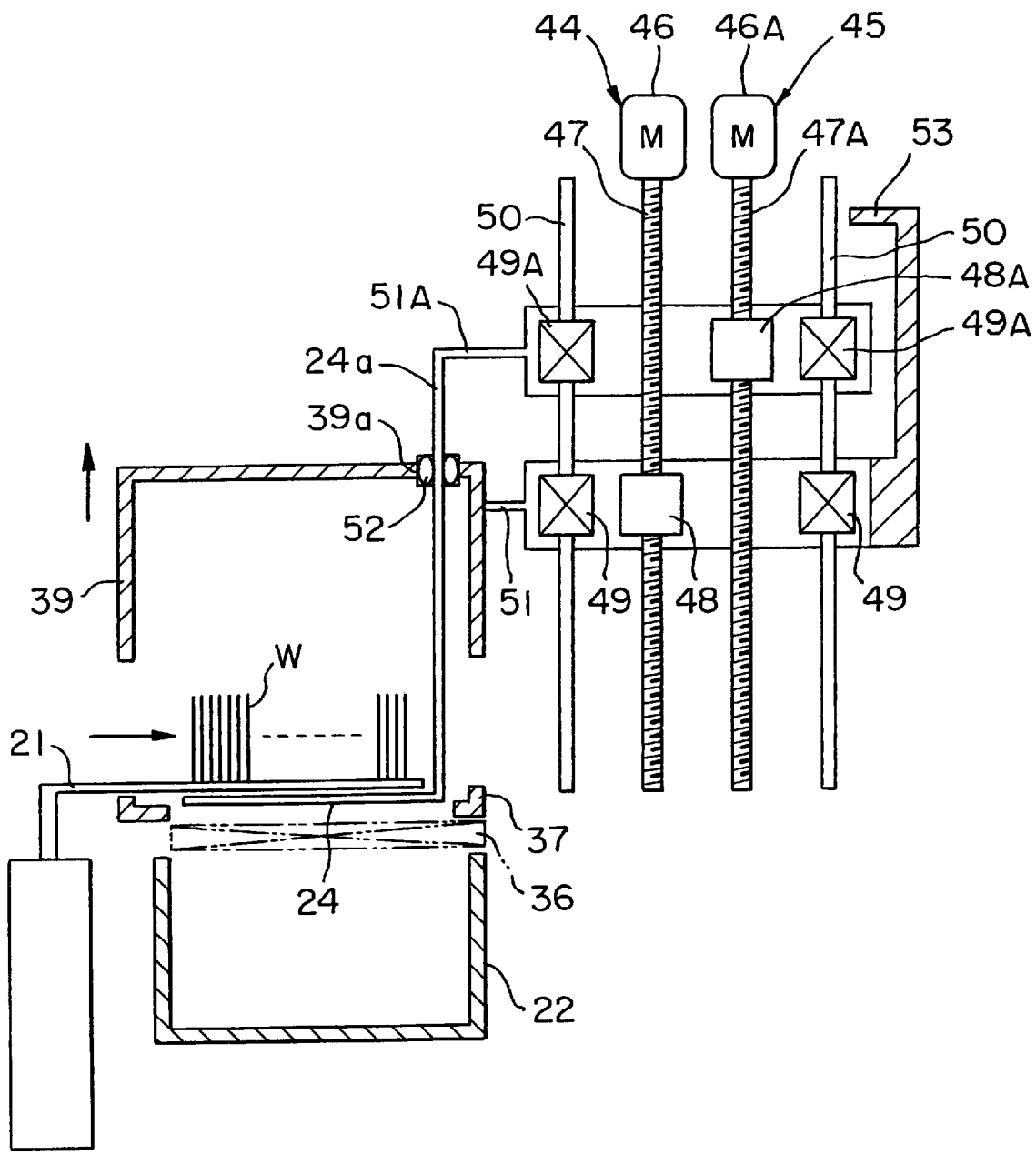
FIG. 13 is a cross sectional view of the elevating means of FIG. 12 under its operating condition.
Figure 14:
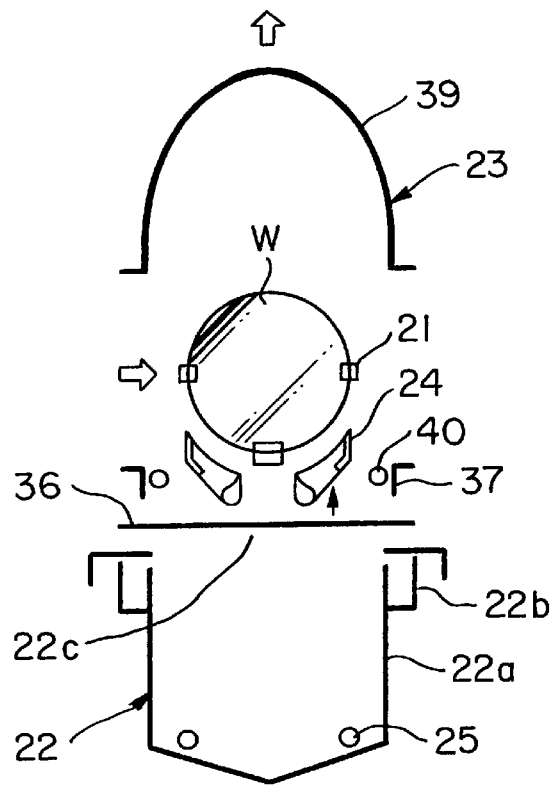
FIG. 14 is a schematic cross sectional view of the cleaning and drying apparatus, showing a condition before delivering substrates to be processed.
Figure 15:
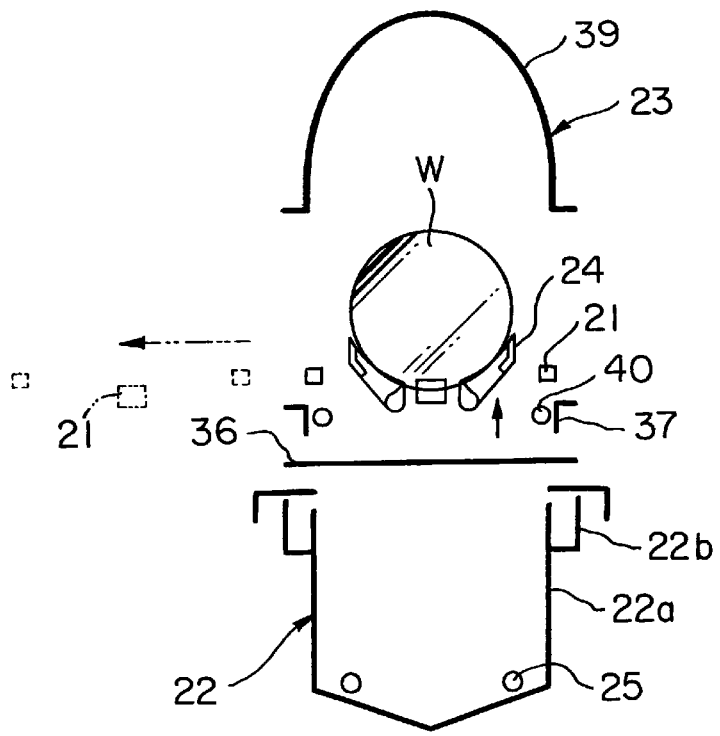
FIG. 15 is a schematic cross sectional view of the cleaning and drying apparatus, showing a condition at the time of delivering the substrates to be processed.
Figure 16:
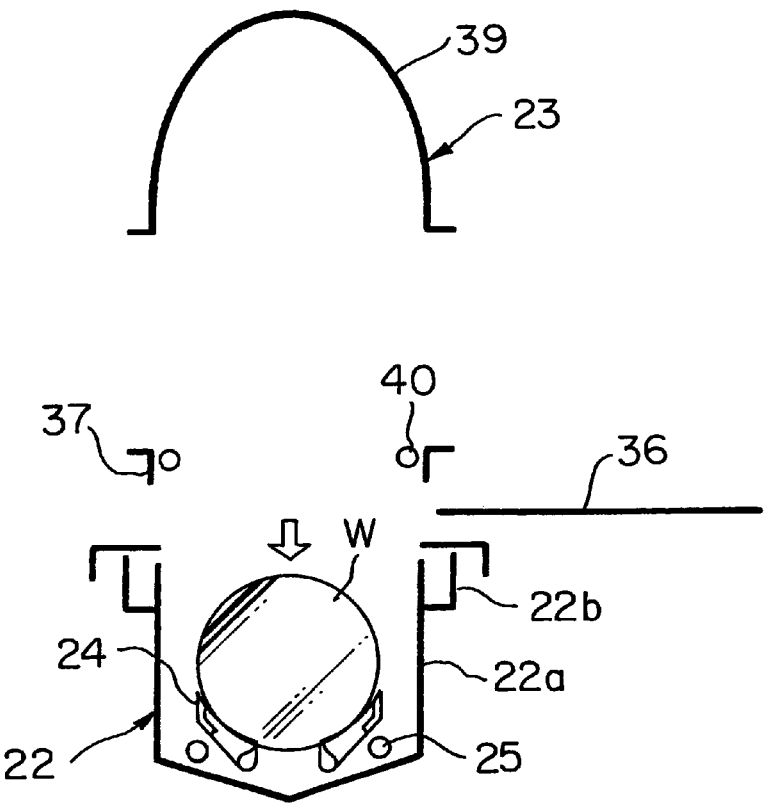
FIG. 16 is a schematic cross sectional view of the cleaning and drying apparatus, showing a condition of loading the substrates into a cleaning bath.
Figure 17:
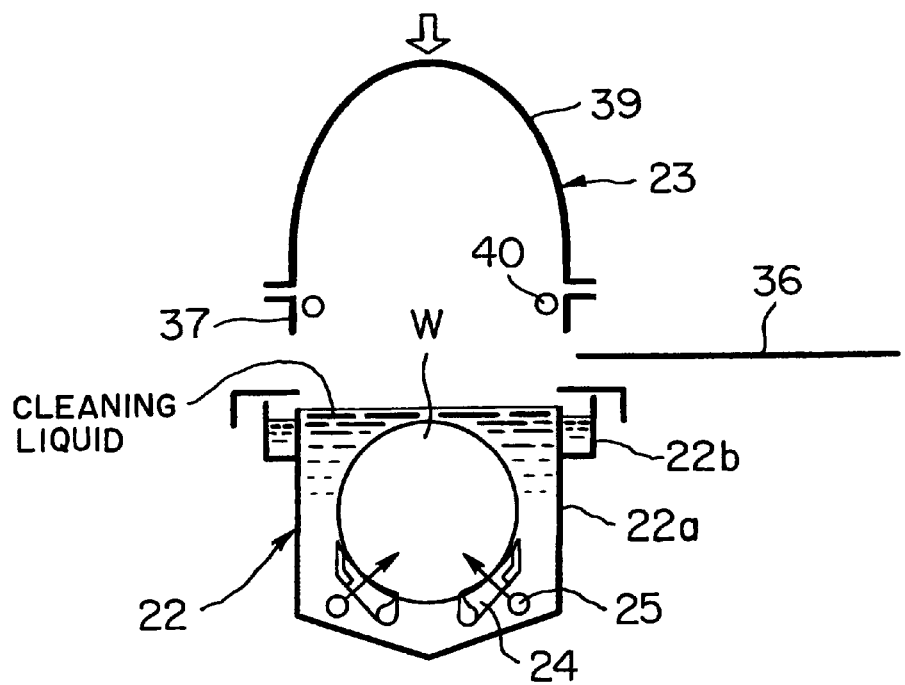
FIG. 17 is a schematic cross sectional view of the cleaning and drying apparatus, showing a condition of cleaning the substrates.

Meanwhile, as shown in FIGS. 12 and 13, owing to the provision of first elevating means 44, the drying chamber body 39 is constructed so as to be elevatable, in other words, separable from the fixed base 37. The first elevating means 44 is in the form of a ball screw mechanism consisting of a screw shaft 47 rotated by a motor 46 and a movable body 48 for thread engagement with the screw shaft 47 through balls. The movable body 48 is coupled to two sliding members 49 sliding on two guide rails 50 running parallel with the screw shaft 47. Since the first elevating means 44 is connected with the drying chamber body 39 through a bracket 51, the body 39 is constructed so as to move in an up-and down motion, While, owing to the provision of second elevating means 45, the wafer boat 24 is constructed so as to be elevatable, in other words, movable both in the cleaning chamber 22 and in the drying chamber 23. Similarly, the second elevating means 45 is in the form of a ball screw mechanism which consists of a screw shaft 47A juxtaposed with the screw shaft 47 of the first elevating means 44 and rotated by a motor 46A and a movable body 48A for thread engagement with the screw shaft 47A through balls. The movable body 48A is coupled to two sliding members 49A sliding on the guide rails 50 running parallel with the screw shaft 47A. By connecting the second elevating means 45 with a rod 24a of the wafer boat 24 through a bracket 51A, the wafer boat 24 can be constructed so as to move in an up-and down motion.

With the above-mentioned arrangement, when elevating the drying chamber body 39 by operating the first elevating means 44, a space for inserting the wafers W can be ensured above the opening 22c of the cleaning bath 22. Under such a situation, the wafers W are laterally loaded by the wafer conveyer arm 21 and thereafter, the wafer boat 24 is elevated to receive the wafers W from the arm 21, by the second elevating means 45 (see FIG. 13).

According to the embodiment, since the first and second elevating means 44, 45 are in the form of a ball screw mechanism and the sliding members 49, 49A slide on the common guide rails 50, the driving mechanism can be simplified and the elevating movements of the chamber body 39 and the wafer boat 24 can be carried out with high accuracy.

Note, the drying chamber body 39 is provided, on one side of the top, with a through hole 39a through which the rod 24a of the wafer boat 24 passes slidably. In order to ensure the air tightness between the through hole 39a and the rod 24a, a sealing mechanism 52 is interposed in a clearance defined between the through hole 39a and the rod 24a.

A movable part associated with the movable body 48 of the first elevating means 44 and the sliding members 49 has a stopper 53 integrally formed to limit the upward movements of the movable body 48A of the second elevating means 45 and the sliding members 49A (see FIGS. 12 and 13). Owing to the provision of the stopper 53, it is possible to avoid the elevating wafer boat 24 from colliding with the drying chamber body 39 by mistake.

We now describe the operation of the above-mentioned cleaning and drying apparatus with reference to FIGS. 14 to 23. Note, the following operations are executed by a not-shown control unit.

At first, on condition that the shutter 36 for the opening 22c of the cleaning bath 22 is closed, the drying chamber body 39 is elevated to form a space above the cleaning bath 22, by the operation of the first elevating means 44. Then, the conveyer arm 21 carrying the wafers W is laterally moved into the space thereby to load the wafers W therein (see FIG. 14). Simultaneously, the wafer boat 24 is elevated by the operation of the second elevating means 45, while the wafer boat 24 receives the wafers W carried by the conveyer arm 21 (see FIG. 15). After withdrawing the conveyer arm 21, the shutter 36 is opened and the wafer boat 24 is lowered by the second elevating means 45 to load the wafers W into the cleaning bath 22 (see FIG. 16). Then, the drying chamber body 39 is also lowered by the first elevating means 44, so that the body 39 comes into tight contact with the fixed base 37. In connection with the above-mentioned steps, the shutter 36 may be opened from the beginning, alternatively.

Thereafter, the chemical (e.g. fluorohydroacid) is supplied from the cleaning liquid nozzles 25 thereby to clean the wafers W. Alternatively, the chemical may be supplied into the cleaning bath 22 in advance. Next, the pure water is ejected from the cleaning liquid nozzles 25 in order to replace the chemical and sequentially, the wafers W are subjected to the cleaning process (see FIG. 17). After cleaning the wafers W, the wafer boat 24 is elevated by the second elevating means 45 to load the wafers W into the drying chamber 23 (see FIG. 18). Then, the shutter 36 is closed so as to insulate the drying chamber 23 from the cleaning bath 22 and the air outside. Note, in the modification, the shutter 36 may be closed during the cleaning process of the wafers W in the cleaning bath 22.

Next, the dry gas, for example mixed gas of IPA and N2 is supplied from the dry-gas source into the drying chamber 23, so that the drying process is carried out due to the contact of the wafers W with IPA (see FIG. 19). During the drying process, a part of the dry gas is discharged from the exhaust part 41.

Figure 20:
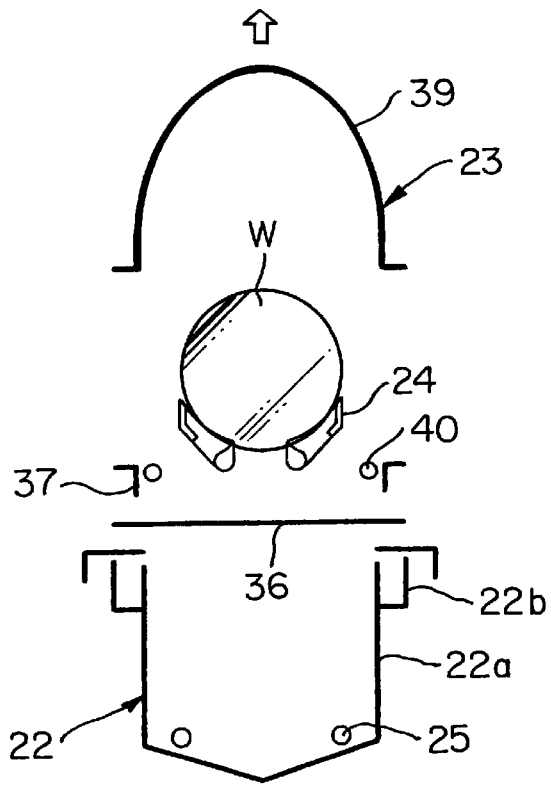
FIG. 20 is a schematic cross sectional view of the cleaning and drying apparatus, showing the drying chamber body elevated after the drying process.
Figure 21:
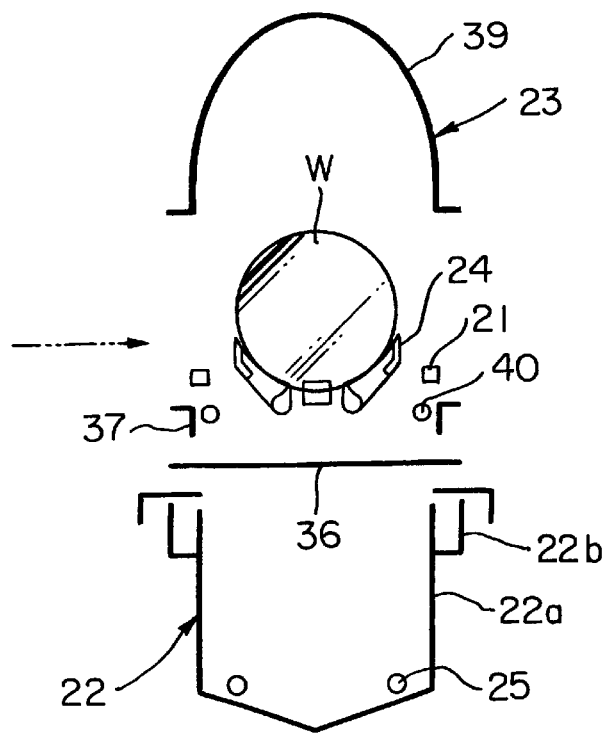
FIG. 21 is a schematic cross sectional view of the cleaning and drying apparatus, showing a condition before receiving the dried substrates.
Figure 22:
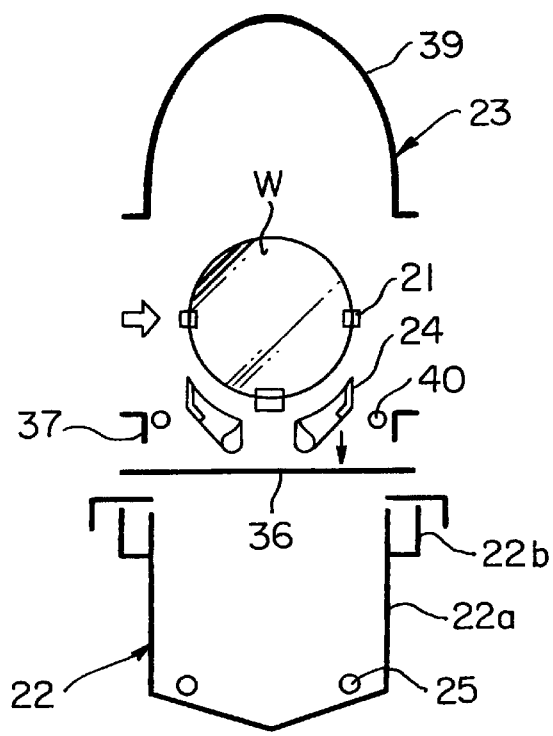
FIG. 22 is a schematic cross sectional view of the cleaning and drying apparatus, showing a condition at the time of receiving the dried substrates.
Figure 23:
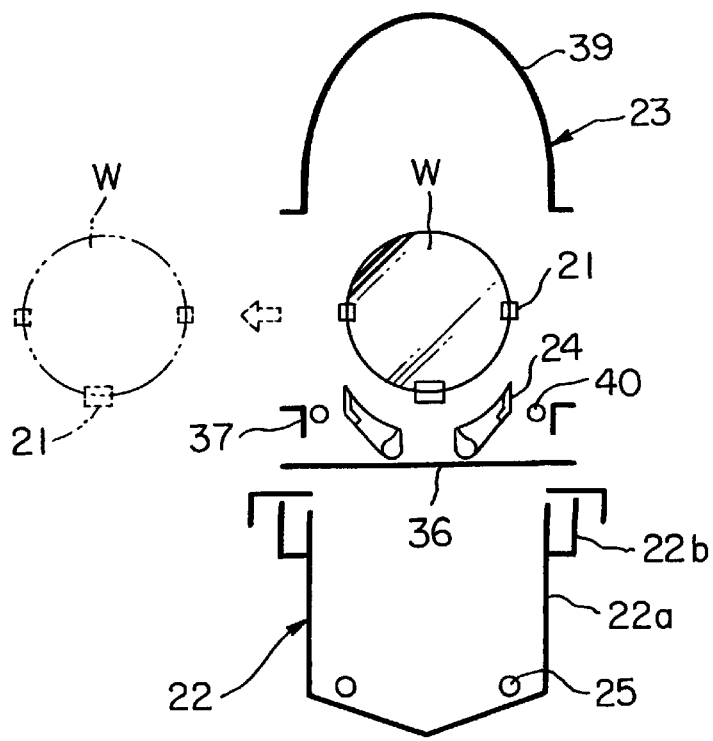
FIG. 23 is a schematic cross sectional view of the cleaning and drying apparatus, showing a condition of unloading the substrates.

After the water drops sticking on the wafers W are replaced with IPA or after the drying process has been completed and sequentially, nitrogen (N2) gas is supplied from the dry-gas supply parts 40 to sweep the drying chamber 23 of IPA atmosphere, the drying chamber body 39 is lifted by the first elevating means 44 to define a space between the drying chamber 22 and the cleaning bath 22 (see FIG. 20). Next, in a flank of the space, the conveyer arm 21 is horizontally moved into the space under the wafer boat 24 (see FIG. 21) and thereafter, the wafer boat 24 is lowered by the second elevating means 45 to deliver the wafers W to the wafer conveyer arm 21 (see FIG. 22). After the delivery of the wafers W, the conveyer arm 21 is withdrawn from the space above the cleaning bath 22 thereby to transport the wafers W to a forthcoming process (see FIG. 23).

As mentioned above, according to the embodiment, since the formation of the space above the cleaning bath 22 due to the elevation of the drying chamber body 39 allows the conveyer arm 21 to move in the flank of the space for delivering the wafers W, it is possible to reduce the apparatus in height in comparison with the conventional apparatus where the wafers are delivered over the drying chamber, whereby the apparatus can be down-sized. Additionally, owing to the reduced moving range of the conveyer arm 21, the moving period can be shortened to improve a throughput of the wafers W.

Although the drying chamber is adapted so as to move upward and downward in the above-mentioned embodiment, the present invention is applicable to any cleaning and drying apparatus on condition that the drying chamber is arranged above the cleaning bath while disposing the shutter between the drying chamber and the cleaning bath.

Additionally, although the above embodiment has been described while applying the cleaning and drying apparatus on the cleaning system for semiconductor wafers, it is natural that the drying apparatus is applicable to processing systems besides the cleaning process. Further, it is a matter of course that the drying apparatus can be used for the LCD glass substrates besides the semiconductor wafers.

[2nd. embodiment]

The second embodiment of the present invention will be described with reference to FIGS. 24–27, as below. Note, in this embodiment, elements similar to those of the first embodiment are indicated with the same reference numerals, respectively, and respective explanations corresponding to these elements will be eliminated in the following description.

Figure 24:
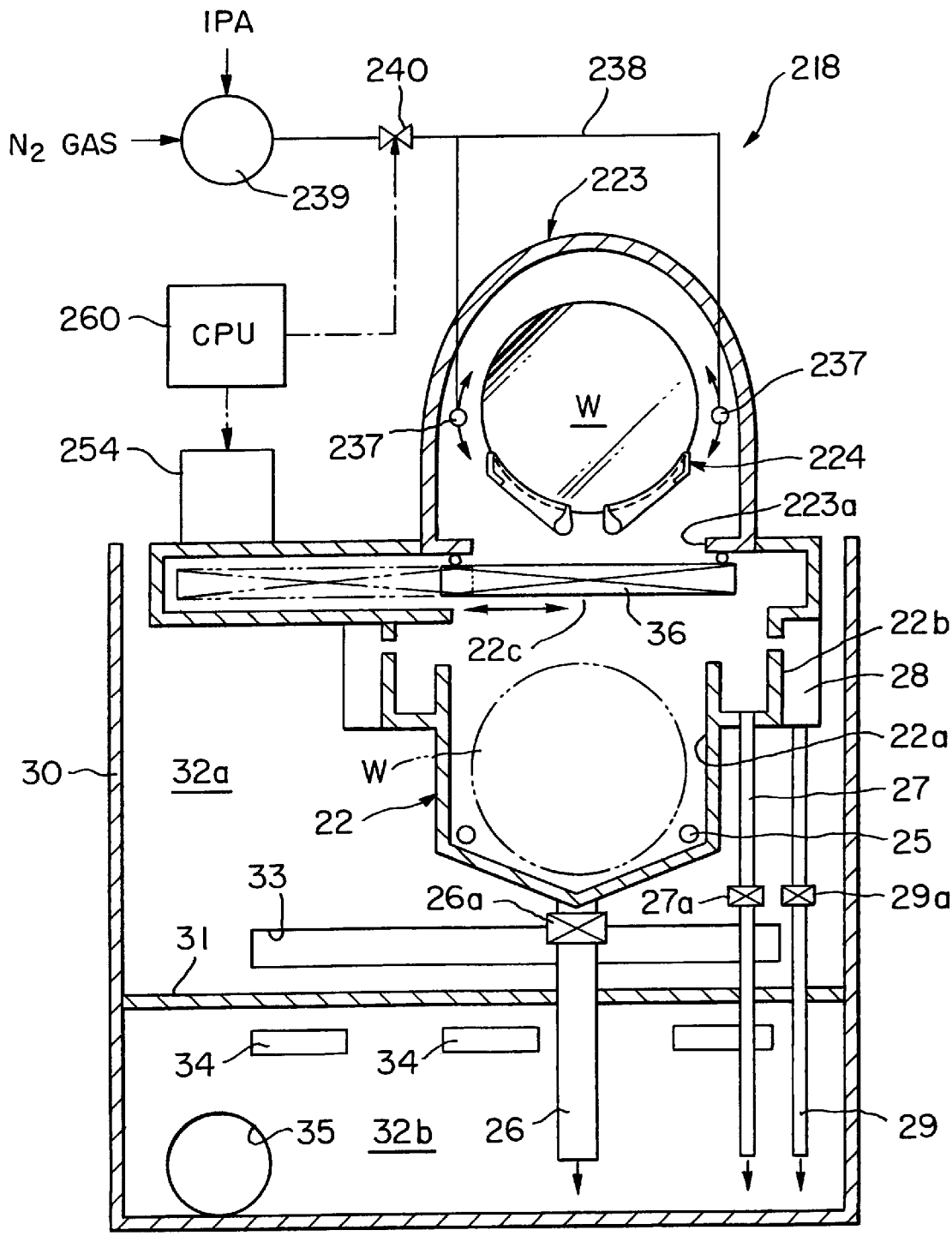
FIG. 24 is a cross sectional view of the cleaning and drying apparatus in accordance with a second embodiment of the invention.
Figure 25:
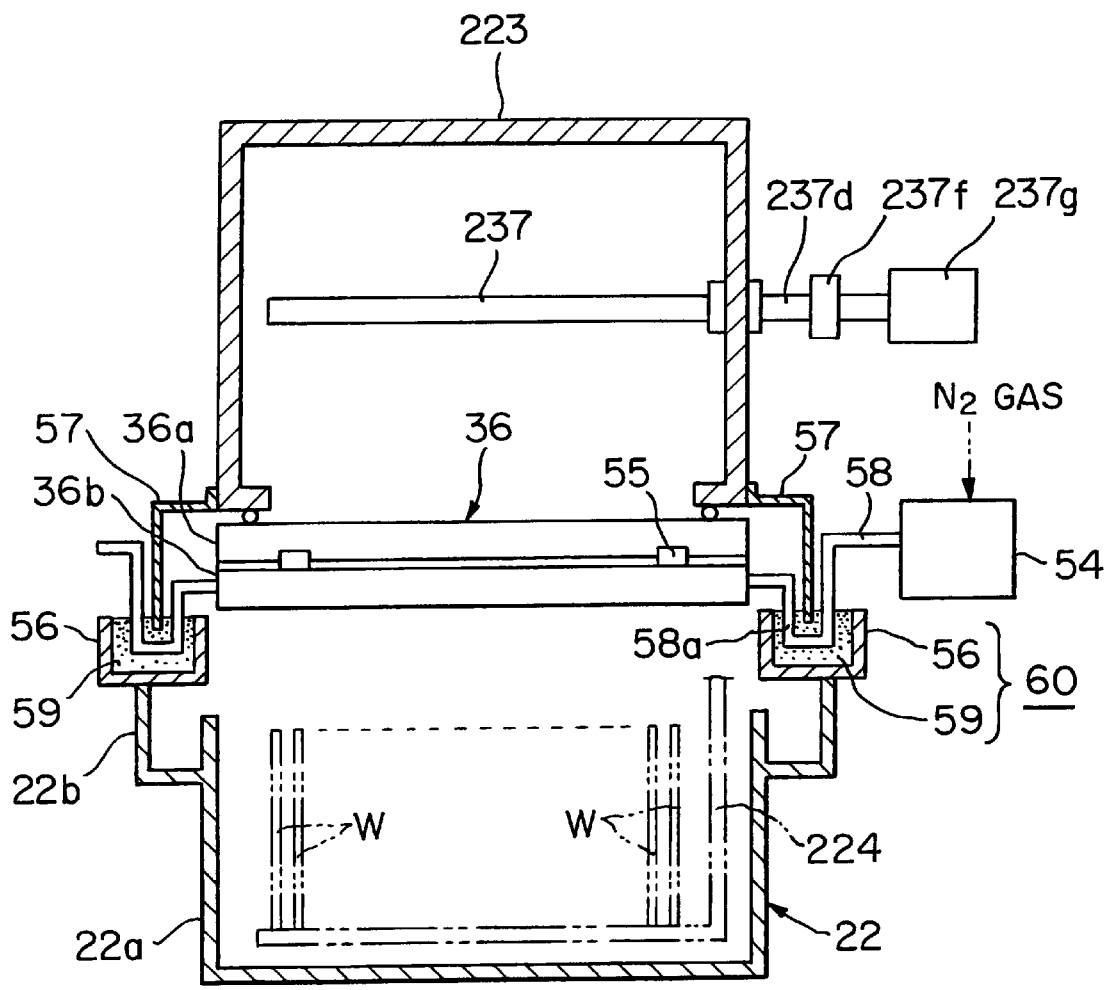
FIG. 25 is a cross sectional side view showing an essential part of the cleaning and drying apparatus of FIG. 24.
Figure 26:
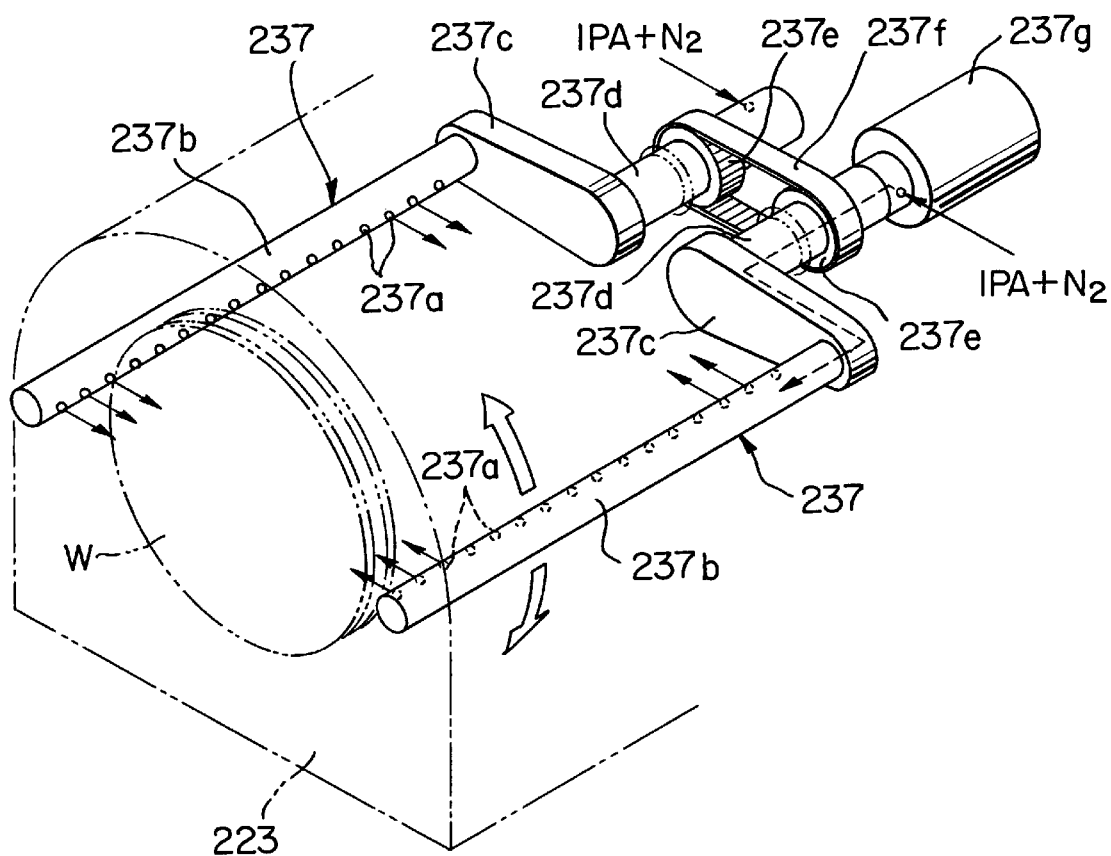
FIG. 26 is a perspective view showing dry-gas supplying means of the cleaning and drying apparatus of FIG. 24, in accordance with the second embodiment of the invention.

FIG. 24 shows a cleaning and drying apparatus 218 of the embodiment. In the figure, a drying chamber 223 is formed by a silica member of reverse U-shaped cross section, which includes an opening 223a communicating with an opening 22c of the cleaning bath 22 through a shutter 236. Inside the drying chamber 223, dry-gas nozzles 237 as dry-gas supplying means are disposed on both upper sides of the chamber 223. As shown in FIGS. 25 and 26, each of the dry-gas nozzles 237 is formed as a shower nozzle of a pipe 237b having nozzle orifices 237a positioned at proper intervals in the longitudinal direction of the pipe 237b. In each of the pipes 237b, an end on one side thereof is arranged so as to penetrate the drying chamber 223 through a sealing mechanism (not shown) and project outwardly. The projecting ends of the respective pipes 237b are connected to rotating shafts 237d through pivot links 237c. Being rotatably born by not-shown bearings, both of the rotating shafts 237d are provided with synchronous pulleys 237e over which a timing belt 237f for transmission is wound. Both dry-gas nozzles 237 are constructed so as to displace along the circumferential direction of the wafers W by a reversible drive motor 237g coupled to the rotating shaft 237d on one side.

The dry-gas nozzles 237 are connected with a dry-gas generator 239 through the intermediary of a supply pipe 238. A not-shown liquid source (e.g. IPA) for the dry gas and a not-shown source of carrier gas (e.g. $N_2$) are connected to the dry-gas generator 239. Further, the supply pipe 238 is provided, on the way to the generator 239, with a control valve 240 by which the supply of dry gas (IPA+$N_2$), which has been produced in the dry-gas generator 239, into the drying chamber 223 through the dry-gas nozzles 237 is controlled. Note, the stop to supply the liquid IPA allows only N2 gas to be introduced to the drying chamber 223 through the dry-gas supply nozzles 237. The opening and closing operations of the control valve 240 is controlled by signals generated from control means, for example a center processing unit (CPU) 260.

In this way, the above-mentioned arrangement makes it possible to blow the dry gas against the surfaces of the wafers W while moving the dry-gas nozzles 237 in the circumferential direction of the wafers W.

Also in this embodiment, the opening and closing of the shutter 36 is accomplished by the open/close moving means 54, as similarly to the first embodiment. The operations of the means 54 and the cylinders 55 are actuated by signals from the above control means, i.e. the CPU 260.

The above-mentioned cleaning and drying apparatus of the embodiment operates as follows.

At first, on condition that the wafers W are accommodated in the cleaning bath 22, the cleaning liquid (e.g. pure water) is collected so as to overflow the bath 22 and the cleaning process is carried out. After cleaning the wafers W, then the pure water L in the cleaning bath 22 is drained through a lower part of the bath 22 and thereafter, a wafer boat 224 is elevated to move the wafers W into the drying chamber 223. Next, under condition that the shutter 36 is closed, the dry gas is supplied through the dry-gas nozzles 237 while moving them in the circumferential direction of the wafers W by the drive motor 237g, so that the dehydration and drying of the wafers W is executed due to the condensation of the pure water L remaining on the wafers W and the dry gas.

In this way, by supplying the dry gas toward the wafers W while moving the dry-gas nozzles 237 in the circumferential direction of the wafers W, it is possible to contact the dry gas with the surfaces of the wafers W uniformly. Accordingly, the drying efficiency can be improved while saving the consumption of the dry gas. Note, after drying the wafers W, then nitrogen gas (N₂) is supplied from the dry-gas nozzles 237 into the drying chamber 223 to complete the drying process of the wafers W.

Figure 27:
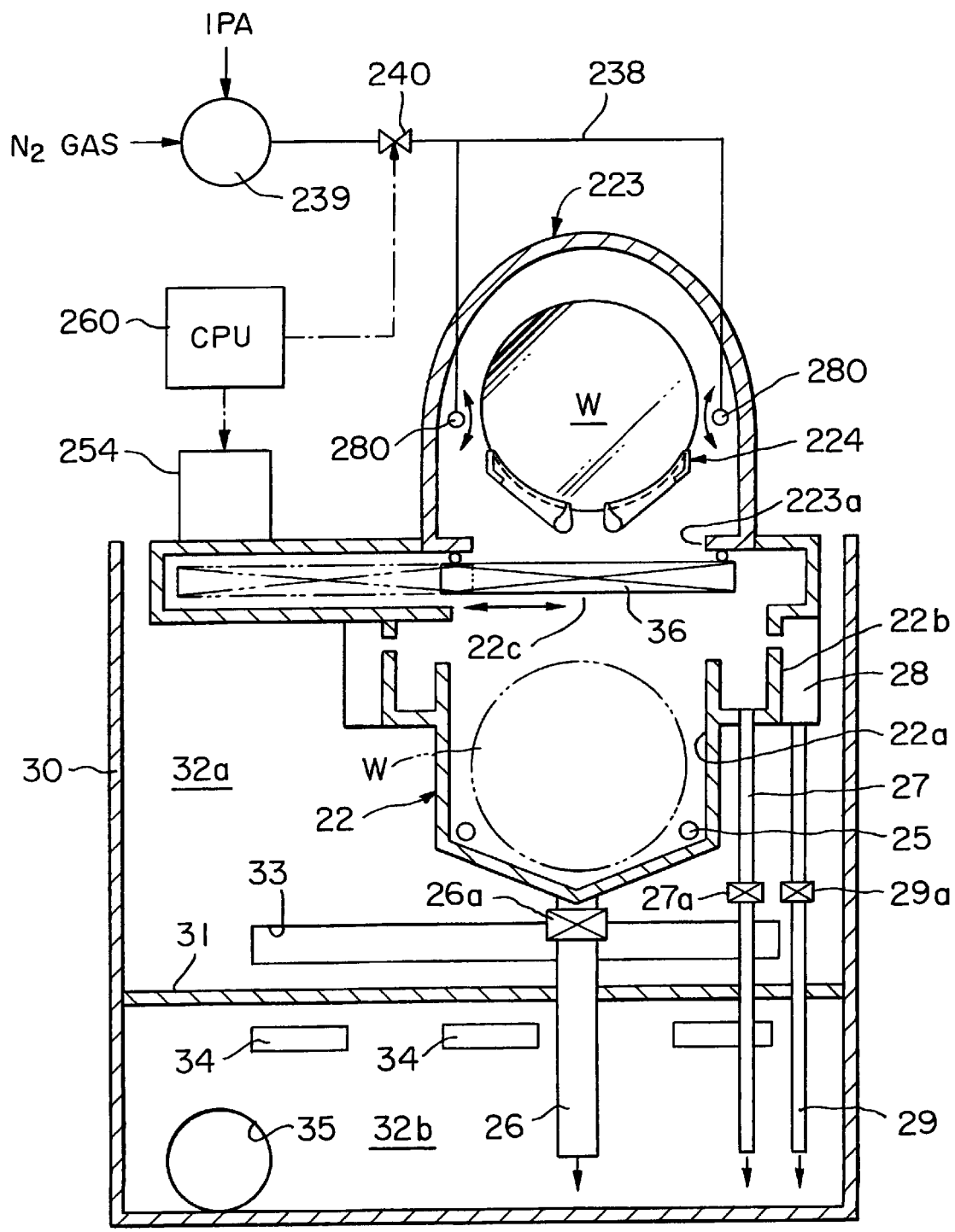
FIG. 27 is a cross sectional view showing another example of the cleaning and drying apparatus of FIG. 24.

In the above-mentioned embodiment, the dry-gas nozzles 237 are moved in the circumferential direction of the wafers W. In the modification, as shown in FIG. 27, dry-gas nozzles 280 on both sides in the drying chamber 223 may be constructed so as to oscillate vertically. Again, although the dry-gas nozzles 237 are in the form of "shower" nozzles in the above-mentioned embodiments, a great number of nozzles having nozzle orifices arranged at appropriate intervals along the arrangement of the wafers W may be substituted for the nozzles 237 in the modification. Note, in FIG. 27, the other elements similar to those in the above-mentioned embodiment are indicated with the same reference numerals, respectively, and the descriptions of the similar elements are being eliminated.

[3rd. embodiment]

Figure 28:
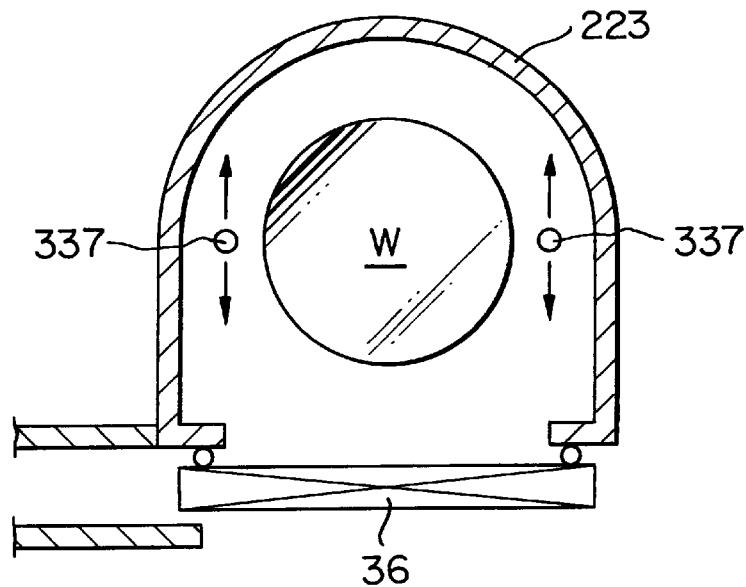
FIG. 28 is a schematic cross sectional view of an essential part of the cleaning and drying apparatus in accordance with a third embodiment of the invention.
Figure 29:
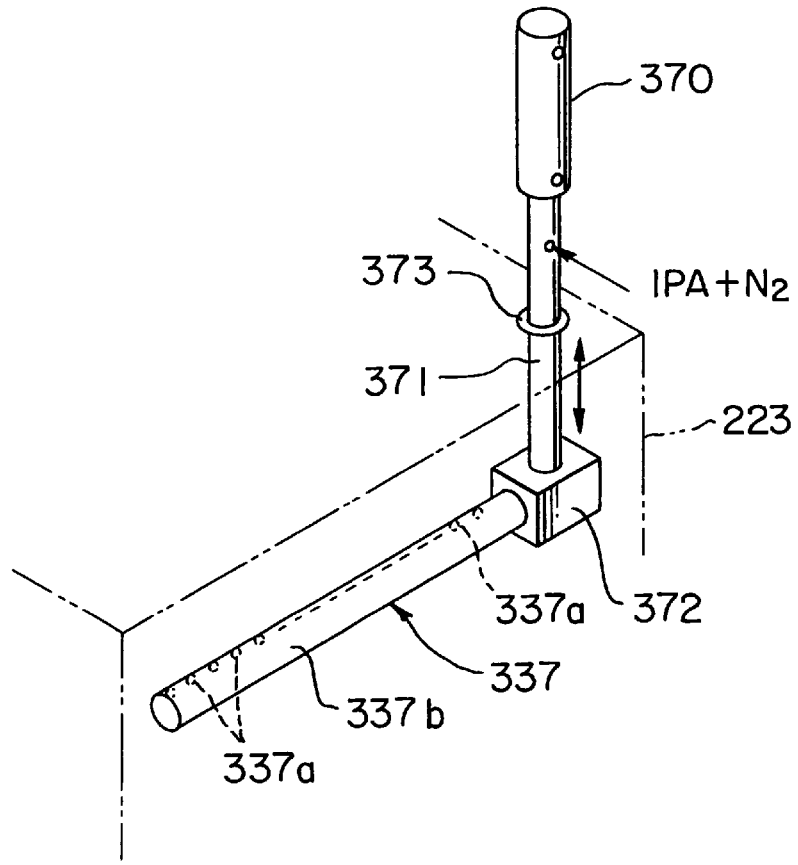
FIG. 29 is a schematic perspective view showing the moving dry-gas supplying means of the cleaning and drying apparatus of FIG. 28, in accordance with third embodiment of the invention.

FIG. 28 is a cross sectional view of an essential part of the third embodiment of the invention and FIG. 29 is a schematic perspective view of the essential part.

According to the third embodiment, dry-gas nozzles 337 are adapted so as to move in the vertical direction. In order to allow the dry-gas nozzles 337 to vertically move in the drying chamber 223, in detail, upward and downward beside the wafers W, each of the dry-gas nozzles 335 is horizontally attached to a carrier member 372. The carrier member 372 is fixed on an end of a plunger 371 of an expansion cylinder 370 suspended on the upper side of the drying chamber 223. In the arrangement, the plunger 371 is arranged so as to penetrate the top of the drying chamber 223 through a sealing mechanism 373. The dry-gas nozzle 337 is connected to the supply pipe 238 (FIG. 27) through the intermediary of communication paths (not shown) formed in the plunger 371 and the carrier member 372.

Note, also in the third embodiment, elements similar to those in the second embodiment are indicated with the same reference numerals, respectively, and the descriptions of the similar elements are being eliminated.

With the above-mentioned arrangement, it is possible to blow the dry gas against the wafers W transported into the drying chamber 223 while moving the dry-gas nozzles 337 in the vertical direction, whereby the dry gas can be contacted with the surfaces of the wafers W uniformly. Accordingly, the drying efficiency can be improved while saving the consumption of the dry gas.

[4th. embodiment]

Figure 30:
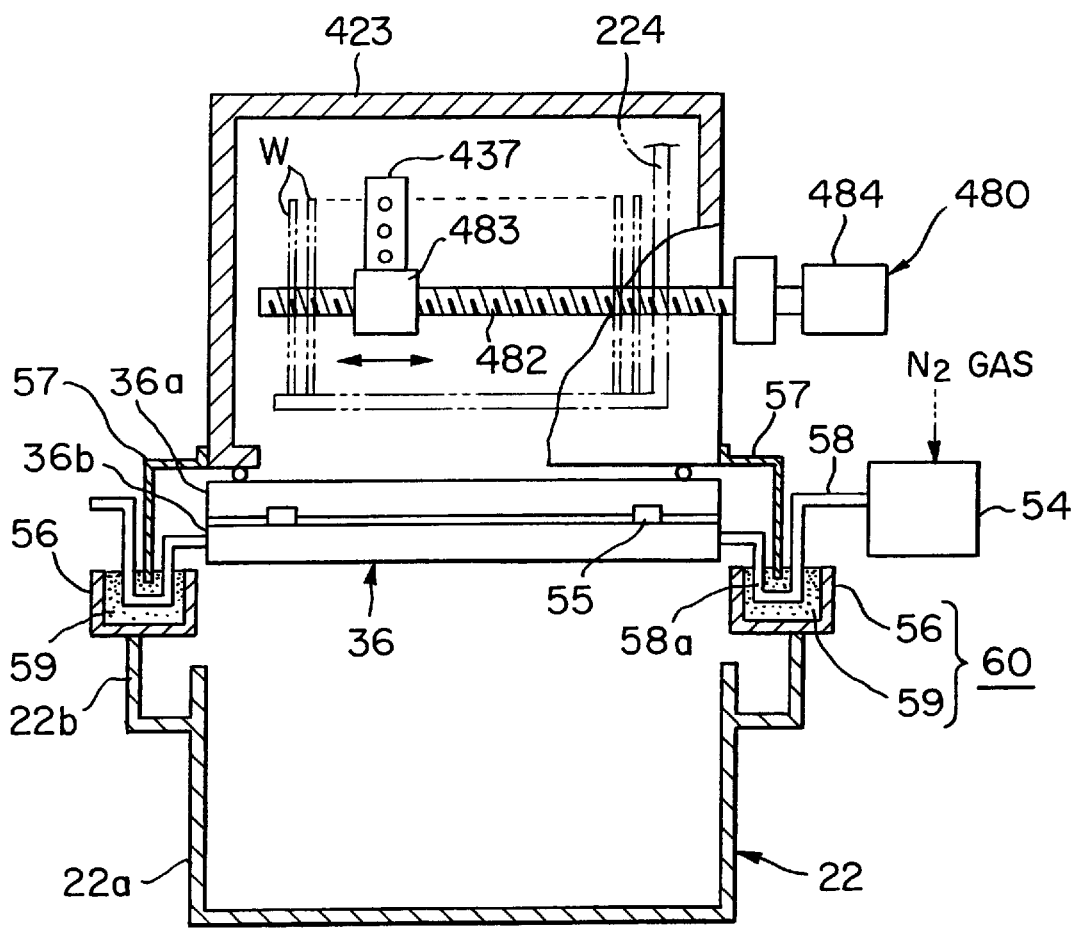
FIG. 30 is a schematic cross sectional view of an essential part of the cleaning and drying apparatus in accordance with a fourth embodiment of the invention.

FIG. 30 is a cross sectional view of an essential part of the fourth embodiment of the invention and FIG. 31 is a schematic perspective view of the essential part.

According to the fourth embodiment, dry-gas nozzles are adapted so as to move in the arrangement direction of the wafers W. The dry-gas nozzles 437 are in the form of shower nozzles each of which is constituted by an arc nozzle body 437h positioned about the wafers W and provided, on an inner side face thereof, with nozzle orifices 437a at proper intervals. Owing to the provision of a ball screw mechanism 480, each dry-gas nozzle 437 is adapted so as to move in the drying chamber 423 horizontally. In detail, ball screw shafts 482 are arranged on both sides of the drying chamber 423 horizontally. Threadly engaged with each ball screw shaft 482 through a not-shown ball is a movable body 483 to which the dry-gas nozzle 437 is connected through a supporting member 481 sliding in a horizontal guide slit 423a formed in a sidewall of the drying chamber 423. Since the ball screw shaft 482 is driven by a reversible motor 484, the dry-gas nozzle 437 can move in the arrangement direction of the wafers W. Note, each dry-gas nozzles 437 is connected to the supply pipe through the intermediary of communication paths (not shown) formed in the movable body 483 and the supporting member 481.

Note, also in the fourth embodiment, elements similar to those in the second embodiment are indicated with the same reference numerals, respectively, and the descriptions of the similar elements are being eliminated.

With the above-mentioned arrangement, it is possible to blow the dry gas against the wafers W transported into the drying chamber 423 while moving the dry-gas nozzles 437 in the arrangement direction of the wafers W, whereby the dry gas can be contacted with the surfaces of the wafers W uniformly. Accordingly, the drying efficiency can be improved while saving the consumption of the dry gas.

[5th. embodiment]

Figure 32:
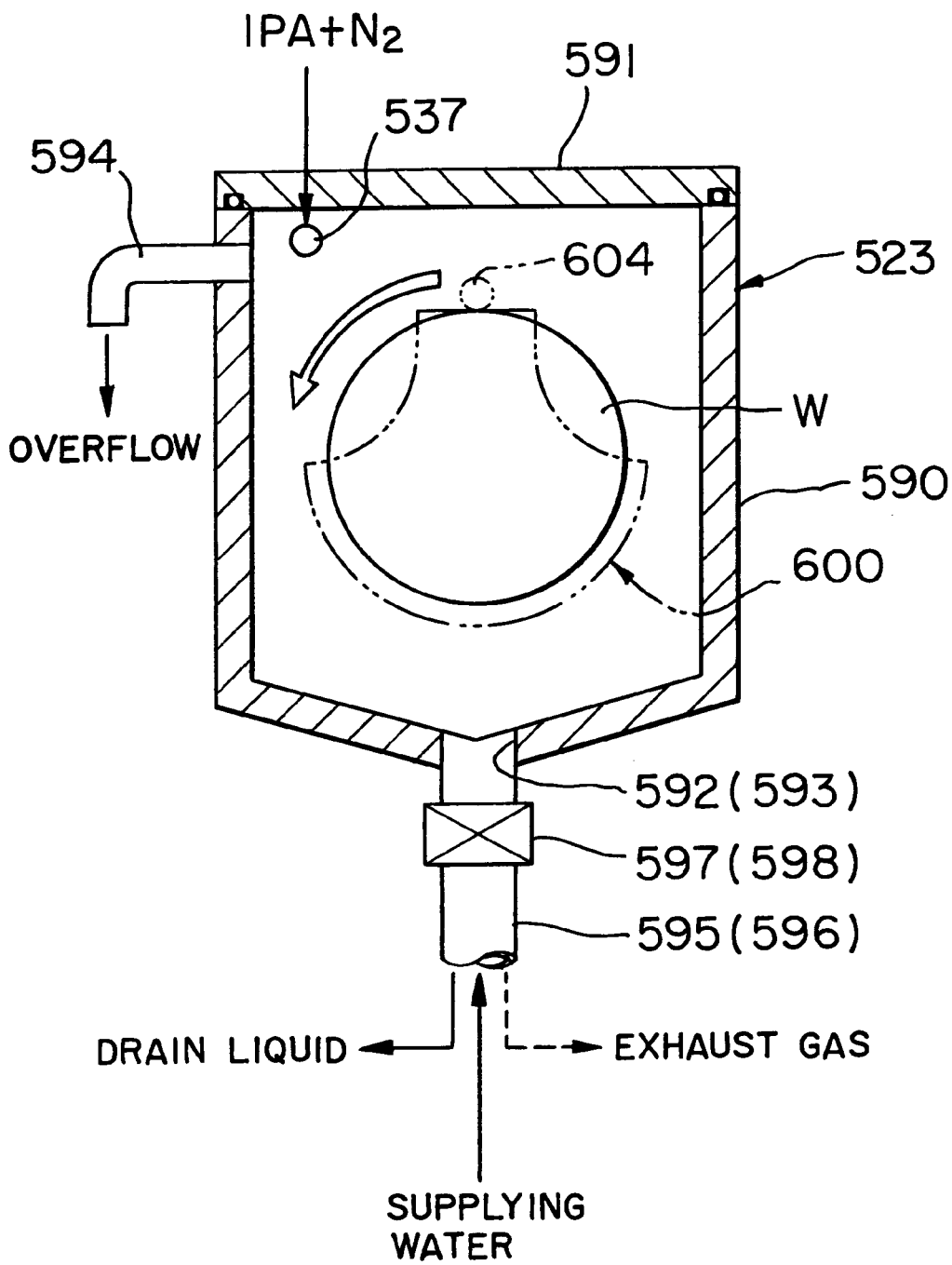
FIG. 32 is a schematic cross sectional view of the cleaning and drying apparatus in accordance with a fifth embodiment of the invention.
Figure 33:
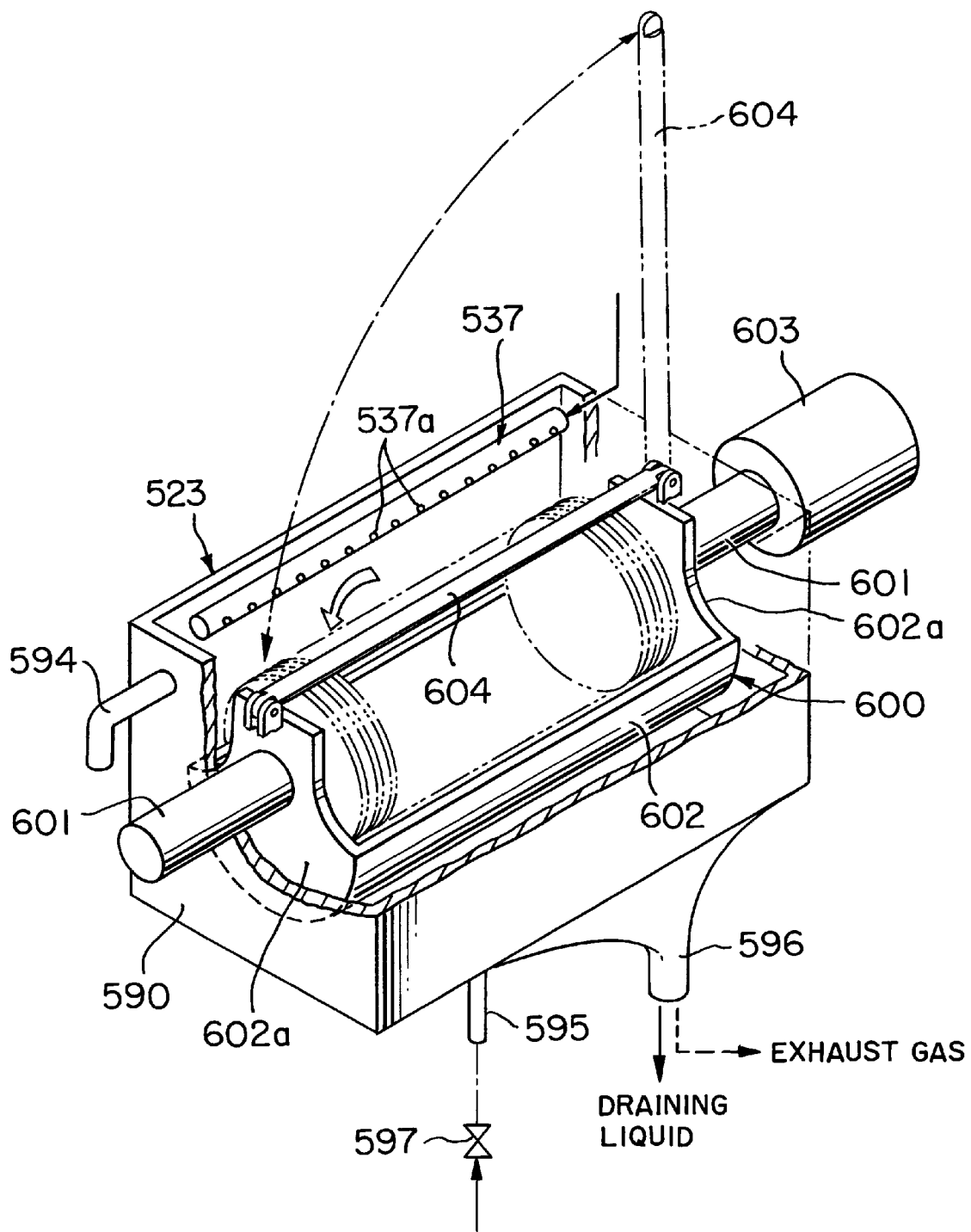
FIG. 33 is a schematic perspective view showing an essential part of the cleaning and drying apparatus of FIG. 32, in accordance with the fifth embodiment of the invention.

FIG. 32 is a schematic cross sectional view of the fifth embodiment of the invention and FIG. 33 is a schematic perspective view of the essential part.

According to the fifth embodiment, the cleaning process and the sequent drying process are executed in a single process chamber serving both as a cleaning and a drying chamber, while the wafers W are rotated with respect to a dry-gas nozzle for the drying process.

In this case, a drying chamber 523, which will be referred as "processing chamber" hereinafter, comprises a box-shaped container 590 which is made of, for example silica members and which can be sealed by a lid 591 also made of, for example a silica member. The container 590 is provided, on a bottom thereof, with a supply port 592 and a drain port 593 for the cleaning liquid such as pure water. Further, on the upper side part of the container 590, an overflow pipe 594 is provided to overflow the pure water filling the container 590. Note, in the embodiment, a control valve 597 is interposed in a supply pipe 595 connected to the supply port 592, while a control valve 598 is interposed in a drain pipe 596 connected to the drain port 593. In addition, an exhaust pipe connected to not-shown exhaust means is diverged from the drain pipe 596.

A dry-gas nozzle 537 is secured on one side of the processing chamber 523 on the opening side. Additionally, in the processing chamber 523, carrier means 600 for carrying a plurality of wafers W (for example fifty wafers) is arranged so as to rotate about an axis along the arrangement direction of the wafers W.

The above carrier means 600 is mainly constituted by a carrier body 602, an upper pusher member 604 for holding the upper portions of the wafers W and a drive motor 603. The carrier body 602 comprises a pair of substantially fan-shaped support plates 602a supported by a horizontal rotating shaft 601 passing through the processing chamber 523 and a not-shown carrier member interposed between the support plates 602a and provided with a plurality of carrier grooves. The upper pusher member 604 is adapted so as to rise and fall from the support plate 602a on one side toward the support plate 602a on the other side. The drive motor 603 is connected with the horizontal rotating shaft 601.

Figure 34:
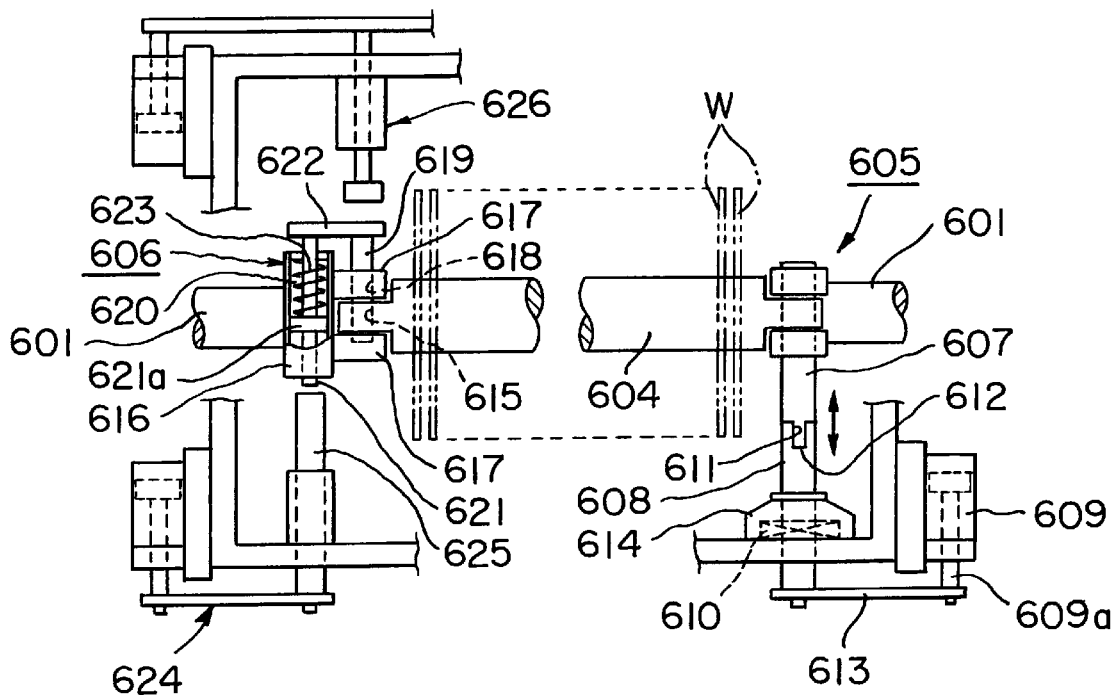
FIG. 34 is a schematic plan view showing a slanting mechanism of an upper press member of the cleaning and drying apparatus of FIG. 32, in accordance with the fifth embodiment of the invention.
Figure 35:
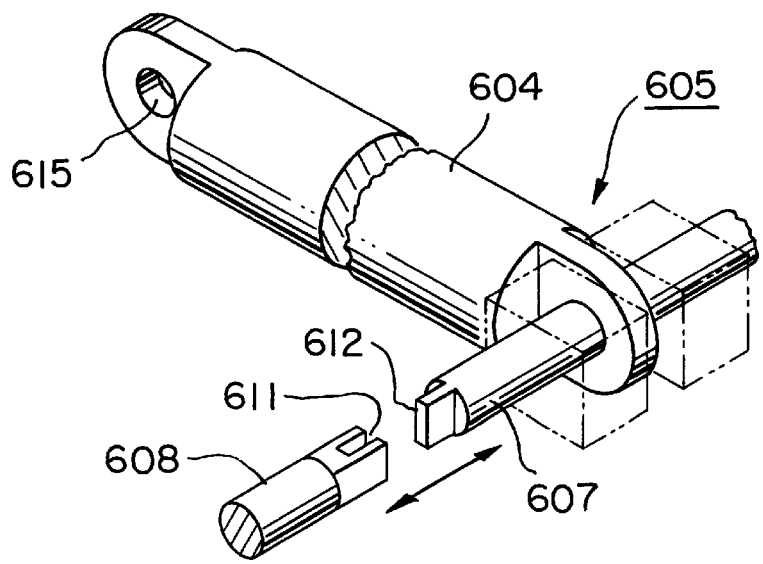
FIG. 35 is a schematic perspective view showing an essential part of the slanting mechanism of the cleaning and drying apparatus of FIG. 32, in accordance with the fifth embodiment of the invention.

In detail, the upper pusher member 604 has one end connected to a closing mechanism 605 and the other end to be fixed on the support plate 602a by a locking mechanism 606. As shown in FIGS. 34 and 35, the closing mechanism 605 comprises a rotating rod 608 having its end disengageably connected with an end of a pivot shaft 607 penetrating the upper pusher member 604, a cylinder 609 mounted on the sidewall of the processing chamber 523, for forward and backward shifting the rotating rod 608 in relation to the pivot shaft 607, and a rotating mechanism 610 for rotating the rotating rod 608. Note, the rotating rod 608 is provided, on a leading end thereof, with a recess 611. On the other hand, the pivot shaft 607 is provided, on a leading end thereof, with a projection 612 for engagement with the recess 611 (see FIGS. 34 and 35). The rotating rod 608 is arranged so as to penetrate the sidewall of the processing chamber 523. Further, an basic end of the rotating rod 608 is rotatably attached to a linking member 613 coupled to a rod 609a of the cylinder 609. The rotating mechanism 610 is accommodated in a seal bracket 614 disposed inside a part of the processing chamber 523 penetrating the rotating rod 608. In the closing mechanism 605, normally, the cylinder 609 is expanded to withdraw the rotating rod 608 in order not to interfere with the rotating carrier means 600. When it is required to raise the upper pusher member 604, the cylinder 609 is shrunk to advance the rotating rod 608 toward the pivot shaft 607 thereby to engage the projection 612 with the recess 611. Thereafter, the rotating mechanism 610 is activated to raise the upper pusher member 604.

Provided on the other side of the upper pusher member 604 is a locking mechanism 606 which can engage in an engagement hole 615 formed on the leading end of the upper pusher member 604 under its tumbled condition, for locking the upper pusher member 604 on the carrier body 602. Essentially, the locking mechanism 606 includes a support block 616 formed so as to extend radially outward of the horizontal rotating shaft 601, a pair of fixing blocks 617 fixed on an end face of the support block 616 to receive the end of the upper pusher member 604 under the tumbled condition, a lock pin 619 to be inserted into through-holes 618 horizontally formed in the fixing blocks 617 so as to communicate with each other, for engagement with the engagement hole 615 of the upper pusher member 604, and a guide pin 621 inserted into a through-hole 620 formed on the leading end of the support block 616, in parallel with the lock pin 619. The length of the lock pin 619 is established so that a leading end thereof penetrates the fixing block 617 on one side and sequent enters into the through-hole 618 of the remaining fixing block 617 on the way. On the contrary, the guide pin 621 is formed of enough length to penetrate the support block 616 perfectly. The lock pin 619 is connected to the guide pin 621 via. a connecting member 622, in parallel with each other. Further, as shown in FIG. 34, a spring 623 is spread in the through-hole 620 of the support block 616 so as to abut on a large diametrical part 621a on the guide pin 621, thereby urging the lock pin 619 in the locking direction, usually.

In the vicinity of the leading end of the guide pin 621 of the above locking mechanism 606, a delocking (releasing) mechanism 624 is arranged to release the locking condition by the lock pin 619. The delocking mechanism 624 includes a slidable push rod 625 which allows the lock pin 619 to disengage from the fixed blocks 617. In addition, on the side of connecting member 622 of the locking mechanism 606, a supplementary mechanism 626 for locking is arranged to ensure the locking operation of the locking mechanism 606.

Figure 36:
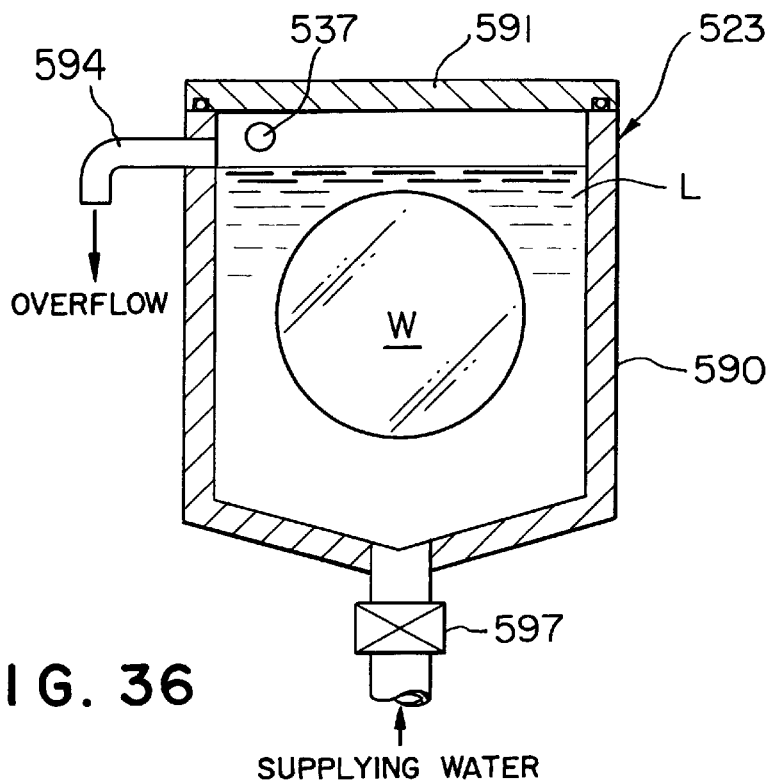
FIG. 36 is a schematic cross sectional view of the cleaning and drying apparatus of FIG. 32, showing a cleaning condition of the apparatus.
Figure 37:
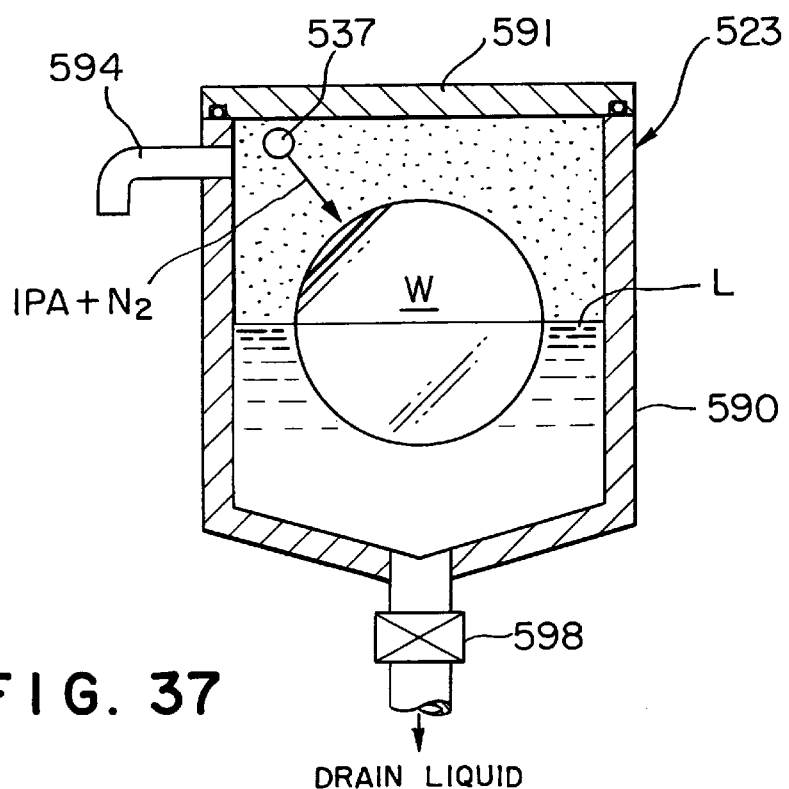
FIG. 37 is a schematic cross sectional view of the cleaning and drying apparatus of FIG. 32, showing a draining condition of the apparatus.
Figure 38:
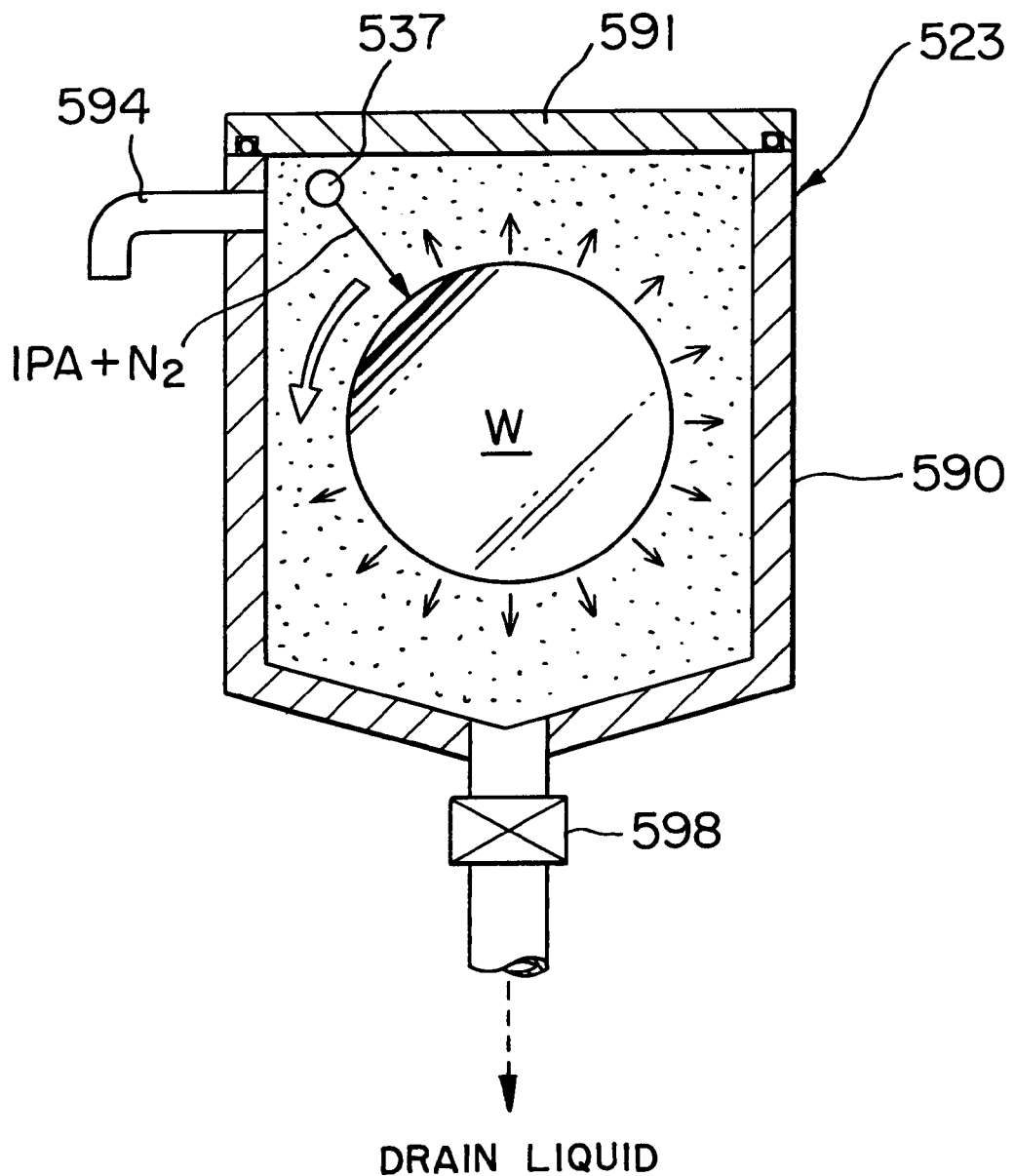
FIG. 38 is a schematic cross sectional view of the cleaning and drying apparatus of FIG. 32, showing a drying condition of the apparatus.

The drying apparatus in accordance with the fifth embodiment operates with reference to FIGS. 36 to 38.

At first, a plurality of wafers W (e.g. fifty wafers) are conveyed into the processing chamber 523 and held by the carrier means 600. Then, the upper pusher member 604 is tumbled down and locked by the locking mechanism 606. Next, the processing chamber 523 is closed with the lid 591.

Under this condition, the cleaning liquid (e.g. pure water) is collected in the processing chamber 523, i.e. the container 590 so as to overflow it through the overflow pipe 594.

After cleaning the wafers W, the pure water L in the container 590 is drained through the lower part of the container 590. Simultaneously, the dry gas (IPA+N2) is supplied into the container 590 through the dry-gas nozzle 537. Thus, the dry gas is brought into contact with the surfaces of the wafers W and the pure water L, so that the moisture on the wafers W is eliminated due to Marangoni effect in the primary drying process. Note, since the perfect elimination of moisture is not required in this primary drying, it may be executed while introducing a small amount of the dry gas.

After the primary drying, as shown in FIG. 38, the motor 603 is energized to rotate the wafers W together with the carrier means 600 as a center of the axis along the arrangement direction of the wafers W, while the dry gas is supplied through the dry-gas nozzle 537. Consequently, due to the condensation of the dry gas and the pure wafer L remaining on the surfaces of the wafers W, the elimination of moisture and the secondary drying are completed. During the secondary drying, the centrifugal force of the rotating wafers W also promotes to dry them. In the secondary drying, it is possible to reduce the supply of dry gas and shorten the drying period since some amount of moisture has been already eliminated in the preceding primary drying. Accordingly, the efficiency of drying can be improved while reducing the consumption of the dry gas. After the secondary drying, the dry gas is replaced with N2 gas thereby to complete the drying process.

Repeatedly, according to the embodiment, the processing chamber 523 is constituted by the sealable container 590 provided, on the bottom, with the supply port 592 and the drain port 593 for cleaning liquid, while the overflow pipe 594 for overflowing the pure water is arranged on the upper part of the container 590. Therefore, since the arrangement allows the processing chamber 523 to be used both as the drying chamber and the cleaning bath, it is possible to realize the miniaturization of the apparatus and improve the cleaning and drying efficiency by the execution of cleaning and drying processes in the same chamber 523.

Although the fifth embodiment has been descried with reference to the case of applying the drying apparatus on the cleaning system for semiconductor wafers, it is natural that the drying apparatus is applicable to processing systems besides the cleaning process. Further, it is a matter of course that the drying apparatus can be used for the LCD glass substrates besides the semiconductor wafers.

Finally, as mentioned above, the cleaning and drying apparatus in accordance with the present invention comprises the processing container having the cleaning chamber which accommodates cleaning liquid for cleaning the object to be processed therein and the drying chamber which is arranged above the cleaning chamber to dry the object to be processed; the shutter arranged between the cleaning chamber of the processing container and the drying chamber, for partitioning the processing container into the cleaning chamber and the drying chamber communicably; the shutter driving unit arranged outside the processing container, for opening and closing the shutter; the communication port formed in an outer wall of the processing container; the connecting member arranged so as to extend through the communication port, for connecting the shutter with the shutter driving unit; and the liquid sealing means for sealing up the communication port through which the connecting member passes, with liquid.

Thus, since the opening and closing part of the shutter can be sealed up with the liquid sealing means in the airtight and watertight manner, it is possible to prevent the particles produced in a driving part of the shutter from invading the drying and cleaning chambers.

Further, according to the present invention, there is also provided the cleaning and drying apparatus comprising the objects carrying means for carrying the objects to be processed so as to be apart from each other in the horizontal direction; the drying chamber for accommodating the objects together with the objects carrying means therein and drying the objects; the dry-gas supply means arranged in the drying chamber, for supplying dry gas to the objects to be processed; and the moving means for carrying the objects and the dry-gas supply means so as to move relatively to each other.

With the above-mentioned arrangement, it is possible to bring the dry gas into uniform contact with the whole surfaces of the objects, whereby the drying efficiency can be improved while reducing the consumption of the dry gas.

What is claimed is:

1. A cleaning and drying apparatus for cleaning and drying an object to be processed, said apparatus comprising:
    a processing container having a cleaning chamber which accommodates cleaning liquid for cleaning the object to be processed therein and a drying chamber which is arranged above said cleaning chamber to dry the object to be processed;
    a shutter arranged between said cleaning chamber and said drying chamber of said processing container, for dividing said processing container into said cleaning chamber and said drying chamber;
    a shutter driving unit arranged outside said processing container, for opening and closing said shutter;
    a communication aperture formed in an outer wall of said processing container;
    a connecting member arranged so as to extend through said communication aperture, for connecting said shutter with said shutter driving unit; and
    liquid sealing means for sealing up said communication aperture through which said connecting member passes, with liquid.

2. A cleaning and drying apparatus as claimed in claim 1, wherein said liquid sealing means comprises:
    a liquid reservoir bath having an inside reservoir bath arranged inside said communication aperture in said outer wall, said inside reservoir bath being opened upward and having its upper opening edge positioned above an upper end of said communication aperture, and an outside reservoir bath arranged outside said communication aperture in said outer wall, said outside reservoir bath being opened upward and having its upper opening edge positioned above said upper end of said communication aperture; and
    sealing liquid stored in said liquid reservoir bath so that liquid surface thereof is above said upper end of said communication aperture and beneath said upper opening end of said liquid reservoir bath;
    wherein said connecting member is bent so as to extend from said shutter to said shutter driving unit by way of an opening of said inside reservoir bath, said communication aperture in said outer wall, and an opening of said outside reservoir bath in sequence, while passing through said sealing liquid.

3. A cleaning and drying apparatus as claimed in claim 2, wherein said liquid reservoir bath is provided, on a lower part thereof, with a supplying port for supplying said sealing liquid from a source thereof and also provided, on an upper part thereof, with a discharging port for discharging said sealing liquid overflowing.

4. A cleaning and drying apparatus as claimed in claim 2, wherein said shutter driving unit includes a driving part for driving said shutter, a casing for enclosing said driving unit and inert gas with which said casing is filled.

5. A cleaning and drying apparatus as claimed in claim 2, wherein said processing container is provided, on an inner wall thereof between said cleaning chamber and said drying chamber, with a sealing surface which receives a plate-shaped periphery of said shutter in its closed position thereby to separate said cleaning chamber from said drying chamber; and
    said shutter comprises upper and lower shutter bodies which are plate-shaped and laid to overlap each other and relative movement means interposed between said upper shutter body and said lower shutter body, for relatively moving said upper and lower shutter bodies in directions close to and apart from each other.

6. A cleaning and drying apparatus as claimed in claim 2, wherein said processing container is provided, on an inner wall thereof between said cleaning chamber and said drying chamber, with a sealing surface which receives a plate-shaped periphery of said shutter in its closed position thereby to separate said cleaning chamber from said drying chamber; and further comprising:
    urging means disposed between said liquid sealing means and said shutter driving unit, for urging and moving said shutter in its closed position toward said sealing surface.

7. A cleaning and drying apparatus comprising:
    objects carrying means for carrying a plurality of objects to be processed so as to be spaced apart from each other in a horizontal direction;
    a drying chamber for accommodating said objects together with said objects carrying means therein and drying said objects;
    dry gas supply means arranged in said drying chamber, for supplying dry gas to said objects to be processed; and
    moving means for moving said objects and said dry-gas supply means relative to each other,
    wherein said objects to be processed are shaped in the form of plates;
    said dry-gas supply means includes a plurality of nozzles arranged at intervals in a direction to arrange said objects to be processed; and
    said moving means operates to move each of said nozzles in a plane parallel with each of said objects in the form of plates.

8. A cleaning and drying apparatus as claimed in claim 7, wherein said dry gas contains vapor of organic solvent.

9. A cleaning and drying apparatus as claimed in claim 7, wherein said moving means operates to move each of said nozzles in a circumferential direction thereof.

10. A cleaning and drying apparatus as claimed in claim 7, wherein said moving means operates to oscillate each of said nozzles in a plane parallel with each of said objects.

11. A cleaning and drying apparatus as claimed in claim 7, wherein said moving means operates to move each of said nozzles vertically.

12. A cleaning and drying apparatus comprising:

objects carrying means for carrying a plurality of objects to be processed so as to be spaced apart from each other in a horizontal direction;

a drying chamber for accommodating said objects together with said objects carrying means therein and drying said objects;

dry gas supply means arranged in said drying chamber, for supplying dry gas to said objects to be processed; and moving means for moving said objects and said dry-gas supply means relativel to each other, wherein said objects to be processed are shaped in the form of plates;

said dry-gas supply means has a nozzle for ejecting gas to said objects to be processed; and said moving means operates to move said nozzle in a direction to arrange said objects to be processed.

13. A cleaning and drying apparatus comprising:

objects carrying means for carrying a plurality of objects to be processed so as to be spaced apart from each other in a horizontal direction;

a drying chamber for accommodating said objects together with said objects carrying means therein and drying said objects;

dry gas supply means arranged in said drying chamber, for supplying dry gas to said objects to be processed; and moving means for moving said objects and said dry-gas supply means relativel to each other, wherein said objects to be processed are shaped in the form of plates;

said dry-gas supply means has a plurality of nozzles arranged at intervals in a direction to arrange said objects to be processed; and said moving means operates to rotate said objects on a center axis along said direction to arrange said objects to be processed.

14. A cleaning and drying apparatus as claimed in claim 13, wherein said drying chamber includes a sealable container which has, on a bottom thereof, a supply port for supplying cleaning liquid and a discharging port for discharging said cleaning liquid and on an upper side of thereof, an overflow pipe for overflowing said cleaning liquid supplied into said sealable container.

15. A cleaning and drying apparatus comprising:

objects carrying means for carrying a plurality of objects to be processed so as to be spaced apart from each other in a horizontal direction;

a drying chamber for accommodating said objects together with said objects carrying means therein and drying said objects;

dry gas supply means arranged in said drying chamber, for supplying dry gas to said objects to be processed; and moving means for moving said objects and said dry-gas supply means relativel to each other, wherein said drying chamber is positioned above a cleaning chamber for cleaning said objects to be processed.

16. A cleaning and drying apparatus as claimed in claim 15, wherein said objects carrying means is movable so as to shuttle between said cleaning chamber and said drying chamber.

17. A cleaning and drying apparatus for cleaning and drying an object to be processed, said apparatus comprising;

a processing container having a cleaning chamber which accommodates cleaning liquid for cleaning the object to be processed therein and a drying chamber which is arranged above said cleaning chamber to dry the object to be processed;

a shutter arranged between said cleaning chamber and said drying chamber of said processing container, for dividing said processing container into said cleaning chamber and said drying chamber;

a shutter driving unit arranged outside said processing container, for opening and closing said shutter;

a communication aperture formed in an outer wall of said processing container;

a connecting member arranged so as to extend through said communication aperture, for connecting said shutter with said shutter driving unit; and a liquid reservoir bath storing sealing liquid therein to seal up said communicating aperture through which said connecting member passes.

18. The cleaning and drying apparatus as claimed in claim 17, wherein said shutter driving unit includes a driving part for driving said shutter, a casing for enclosing said driving unit and inert gas with which said casing is filled.

19. The cleaning and drying apparatus as claimed in claim 17, wherein said processing container is provided, on an inner wall thereof between said cleaning chamber and said drying chamber, with a sealing surface which receives a plate-shaped periphery of said shutter in its closed position thereby to separate said cleaning chamber from said drying chamber; and said shutter comprises upper and lower shutter bodies which are plate-shaped and laid to overlap each other and relative movement actuator interposed between said upper shutter body and said lower shutter body, for relatively moving said upper and lower shutter bodies in directions close to and apart from each other.

20. The cleaning and drying apparatus as claimed in claim 17, wherein said processing container is provided, on an inner wall thereof between said cleaning chamber and said drying chamber, with a sealing surface which receives a plate-shaped periphery of said shutter in its closed position thereby to separate said cleaning chamber from said drying chamber; and further comprising:

an urging actuator disposed between said liquid reservoir bath and said shutter driving unit, for urging and moving said shutter in its closed position toward said sealing surface.

21. A cleaning and drying apparatus comprising:

a wafer boat carrying a plurality of objects to be processed so as to be apart from each other in a horizontal direction;

a drying chamber for accommodating said objects together with said wafer boat therein and drying said objects;

a gas shower head arranged in said drying chamber, for supplying dry gas to said objects to be processed, wherein said objects to be processed are shaped in the form of plates; and actuator moving said objects and said nozzle relatively to each other, wherein said gas shower head includes a plurality of nozzles arranged at intervals in a direction to arrange said objects to be processed, and wherein said moving actuator operates to move each of said nozzles in a plane substantially parallel with each of said objects in the form of plates.

22. The cleaning and drying apparatus as claims in claim 21, wherein said dry gas contains vapor of organic solvent.

23. The cleaning and drying apparatus as claimed in claim 21, wherein said moving actuator operates to move each of said nozzles in a circumferential direction thereof.

24. The cleaning and drying apparatus as claimed in claim 21, wherein said moving actuator operates to oscillate each of said nozzles in a plane parallel with each of said objects.

25. The cleaning and drying apparatus as claimed in claim 21, wherein said moving actuator operates to move each of said nozzles vertically.

26. The cleaning and drying apparatus as claimed in claim 21, wherein said objects to be processed are shaped in the form of plates, wherein said gas shower head has a nozzle for ejecting gas to said objects to be processed, and wherein said moving actuator operates to move said nozzle in a direction to arrange said objects to be processed.

27. The cleaning and drying apparatus as claimed in claim 21, wherein said wafer boat is movable so as to shuttle between said cleaning chamber and said drying chamber.

28. The cleaning and drying apparatus as claimed in claim 27, wherein said wafer boat is movable so as to shuttle between said cleaning chamber and said drying chamber.

29. A cleaning and drying apparatus comprising:

a wafer boat carrying a plurality of objects to be processed so as to be apart from each other in a horizontal direction;

a drying chamber for accommodating said objects together with said wafer boat therein and drying said objects;

a gas shower head arranged in said drying chamber, for supplying dry gas to said objects to be processed, wherein said objects to be processed are shaped in the form of plates; and actuator moving said objects and said nozzle relatively to each other, wherein said gas shower head includes a plurality of nozzles arranged at intervals in a direction to arrange said objects to be processed, and wherein said moving actuator operates to rotate said objects on a center axis along said direction to arrange said objects to be processed.

30. The cleaning and drying apparatus as claimed in claim 29, wherein said drying chamber includes a sealable container which has, on a bottom thereof, a supply port for supplying cleaning liquid and a discharging port for discharging said cleaning liquid and on an upper side of thereof, an overflow pipe for overflowing said cleaning liquid supplied into said sealable container.

* * * * *